United States Patent
Ko et al.

(10) Patent No.: US 10,134,723 B2
(45) Date of Patent: Nov. 20, 2018

(54) ELECTROSTATIC DISCHARGE PROTECTION DEVICE AND ELECTRONIC DEVICE HAVING THE SAME

(71) Applicant: Samsung Electronics Co., Ltd., Suwon-si (KR)

(72) Inventors: Jae-Hyok Ko, Hwaseong-si (KR); Han-Gu Kim, Seongnam-si (KR); Jong-Kyu Song, Incheon (KR); Jin Heo, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/708,452

(22) Filed: Sep. 19, 2017

(65) Prior Publication Data
US 2018/0012883 A1    Jan. 11, 2018

Related U.S. Application Data

(62) Division of application No. 14/809,299, filed on Jul. 27, 2015, now Pat. No. 9,799,641.

(30) Foreign Application Priority Data

Dec. 8, 2014 (KR) .......................... 10-2014-0174759

(51) Int. Cl.
*H01L 27/02* (2006.01)

(52) U.S. Cl.
CPC ........ *H01L 27/0262* (2013.01); *H01L 27/027* (2013.01)

(58) Field of Classification Search
CPC .................................................. H01L 27/0262
(Continued)

(56) References Cited

U.S. PATENT DOCUMENTS 5,872,379 A    2/1999  Lee
5,909,347 A    6/1999  Yu
(Continued)

FOREIGN PATENT DOCUMENTS

JP    2002524878    8/2002
JP    2012174740    9/2012
(Continued)

OTHER PUBLICATIONS

"Electrostatic Discharge Protection Device and Electronic Device Having the Same" Specification, Drawings, and Prosecution History of U.S. Appl. No. 14/809,299, filed Jul. 27, 2015, by Jae-Hyok Ko, et al.
(Continued)

*Primary Examiner* — Asok K Sarkar
*Assistant Examiner* — Grant Withers
(74) *Attorney, Agent, or Firm* — Onello & Mello, LLP.

(57) ABSTRACT

In an ESD protection device, a first well of a first conductivity type and a second well of a second conductivity type are formed in a substrate to contact each other. A first impurity region of the first conductivity type and a second impurity region of the second conductivity type are formed in the first well, and are electrically connected to a first electrode pad. The second impurity region is spaced apart from the first impurity region in a direction of the second well. A third impurity region is formed in the second well, has the second conductivity type, and is electrically connected to a second electrode pad. A fourth impurity region is formed in the second well, is located in a direction of the first well from the third impurity region to contact the third impurity region, has the first conductivity type, and is electrically floated.

19 Claims, 25 Drawing Sheets

(58) Field of Classification Search
USPC .......... 257/142, 133, 124, 148, 173, 593
See application file for complete search history.

(56) References Cited

U.S. PATENT DOCUMENTS

| | | |
|---|---|---|
| 6,172,403 B1 | 1/2001 | Chen |
| 6,172,404 B1 | 1/2001 | Chen et al. |
| 6,246,079 B1 | 6/2001 | Chen |
| 6,249,414 B1 | 6/2001 | Lee et al. |
| 6,433,368 B1 | 8/2002 | Vashchenko et al. |
| 6,696,708 B2 | 2/2004 | Hou et al. |
| 6,717,219 B1 | 4/2004 | Vashchenko et al. |
| 7,098,522 B2 | 8/2006 | Lin et al. |
| 8,653,557 B2 | 2/2014 | Van Wijmeersch et al. |
| 8,710,545 B2 | 4/2014 | Lai et al. |
| 9,502,399 B1 | 11/2016 | Smith et al. |
| 2001/0007521 A1 | 7/2001 | Chen |
| 2002/0056876 A1 | 5/2002 | Schroeder et al. |
| 2004/0100746 A1 | 5/2004 | Chen et al. |
| 2007/0069310 A1 | 3/2007 | Song et al. |
| 2008/0067602 A1 | 3/2008 | Tyler et al. |
| 2008/0067605 A1 | 3/2008 | Tyler et al. |
| 2009/0032837 A1 | 2/2009 | Tseng et al. |
| 2011/0204415 A1 | 8/2011 | Van Wijmeersch et al. |
| 2014/0061716 A1 | 3/2014 | Zhan et al. |
| 2014/0210003 A1 | 7/2014 | Ko et al. |
| 2015/0076557 A1 | 3/2015 | Salcedo et al. |
| 2016/0141358 A1 | 5/2016 | Salcedo et al. |
| 2016/0268245 A1 | 9/2016 | Chen et al. |
| 2016/0343701 A1 | 11/2016 | Zhong et al. |

FOREIGN PATENT DOCUMENTS

| | | |
|---|---|---|
| JP | 2013520789 | 6/2013 |
| JP | 5243773 | 7/2013 |
| KR | 2002015199 | 2/2002 |
| KR | 100504203 | 7/2005 |
| KR | 100642651 | 10/2006 |
| KR | 101281784 | 7/2013 |

OTHER PUBLICATIONS

"Analysis of SCR-Based ESD Protection Circuit on Holding Voltage Characteristics" by Yong Seo Koo, et al.; World Academy of Science, Engineering and Technology International Journal of Electrical, Computer, Energetic, Electronic and Communication Engineering vol. 8, No. 7, 2014.

ELECTROSTATIC DISCHARGE PROTECTION DEVICE AND ELECTRONIC DEVICE HAVING THE SAME

CROSS-REFERENCE TO RELATED APPLICATION(S)

This application is a divisional of U.S. patent application Ser. No. 14/809,299, filed Jul. 27, 2015, which claims priority under 35 USC § 119 to Korean Patent Application No. 10-2014-0174759, filed on Dec. 8, 2014 in the Korean Intellectual Property Office (KIPO), the contents of which are herein incorporated by reference in their entirety.

BACKGROUND

1. Technical Field

Exemplary embodiments in accordance with principles of inventive concepts relate to electrostatic discharge (ESD) protection technology, and more particularly to an ESD protection device and an electronic device including the ESD protection device.

2. Description of the Related Art

As the size of semiconductor devices decrease and the density of semiconductor devices increases, an ESD protection device, which protects the semiconductor device from damage caused by an ESD, becomes more important.

Conventionally, a diode, a resistor, and a transistor are generally used in an ESD protection device. More recently, a silicon controlled rectifier (SCR) is widely used as an ESD protection device.

However, when the holding voltage of the SCR is lower than an operational voltage of the semiconductor device, the semiconductor device may not operate correctly.

SUMMARY

Some exemplary embodiments are directed to provide an electrostatic discharge (ESD) protection device that has a high holding voltage.

Some exemplary embodiments are directed to provide an electronic device including the ESD protection device.

According to exemplary embodiments, an electrostatic discharge (ESD) protection device includes a semiconductor substrate, a first well, a second well, a first impurity region, a second impurity region, a third impurity region, and a fourth impurity region. The first well is formed in the semiconductor substrate, and has a first conductivity type. The second well is formed in the semiconductor substrate, contacts the first well, and has a second conductivity type. The first impurity region is formed in the first well, has the first conductivity type, and is electrically connected to a first electrode pad. The second impurity region is formed in the first well, is spaced apart from the first impurity region in a direction of the second well, has the second conductivity type, and is electrically connected to the first electrode pad. The third impurity region is formed in the second well, has the second conductivity type, and is electrically connected to a second electrode pad. The fourth impurity region is formed in the second well, is located in a direction of the first well from the third impurity region to contact the third impurity region, has the first conductivity type, and is electrically floated.

In exemplary embodiments, the ESD protection device may further include a fifth impurity region. The fifth impurity region may be formed in the second well, be spaced apart from the fourth impurity region in a direction of the first well, have the second conductivity type, and be electrically floated.

An impurity concentration of the fifth impurity region may be higher than an impurity concentration of the second well.

A holding voltage of the ESD protection device may be determined based on a width of the fifth impurity region.

The ESD protection device may further include a sixth impurity region and a gate. The sixth impurity region may be formed at a boundary region between the first well and the second well, have the second conductivity type, and is electrically floated. The gate may be formed above the semiconductor substrate between the second impurity region and the sixth impurity region, and be electrically connected to the first electrode pad.

An impurity concentration of the sixth impurity region may be higher than an impurity concentration of the second well.

Impurity concentrations of the first impurity region and the fourth impurity region may be substantially the same, and impurity concentrations of the second impurity region, the third impurity region, the fifth impurity region, and the sixth impurity region may be substantially the same.

The first impurity region and the fourth impurity region may be formed at the same time by a same ion implantation process, and the second impurity region, the third impurity region, the fifth impurity region, and the sixth impurity region may be formed at the same time by a same ion implantation process.

In exemplary embodiments, the ESD protection device may further include a fifth impurity region. The fifth impurity region may be formed in the first well, be spaced apart from the second impurity region in a direction of the second well, have the first conductivity type, and be electrically floated.

An impurity concentration of the fifth impurity region may be higher than an impurity concentration of the first well.

A holding voltage of the ESD protection device may be determined based on a width of the fifth impurity region.

The ESD protection device may further include a sixth impurity region and a gate. The sixth impurity region may be formed at a boundary region between the first well and the second well, have the first conductivity type, and be electrically floated. The gate may be formed above the semiconductor substrate between the fourth impurity region and the sixth impurity region, and be electrically connected to the second electrode pad.

An impurity concentration of the sixth impurity region may be higher than an impurity concentration of the first well.

Impurity concentrations of the second impurity region and the third impurity region may be substantially the same, and impurity concentrations of the first impurity region, the fourth impurity region, the fifth impurity region, and the sixth impurity region may be substantially the same.

The second impurity region and the third impurity region may be formed at the same time by a same ion implantation process, and the first impurity region, the fourth impurity region, the fifth impurity region, and the sixth impurity region may be formed at the same time by a same ion implantation process.

In exemplary embodiments, the first conductivity type may correspond to n-type, and the second conductivity type may correspond to p-type.

The first electrode pad may be coupled to a supply voltage, and the second electrode pad may be coupled to a ground voltage.

In exemplary embodiments, the first conductivity type may correspond to p-type, and the second conductivity type may correspond to n-type.

The first electrode pad may be coupled to a ground voltage, and the second electrode pad may be coupled to a supply voltage.

According to exemplary embodiments, an ESD protection device includes a semiconductor substrate, a first well, a second well, a first impurity region, a second impurity region, a third impurity region, a fourth impurity region, a fifth impurity region, a sixth impurity region, and a gate. The first well is formed in the semiconductor substrate, and has a first conductivity type. The second well is formed in the semiconductor substrate, contacts the first well, and has a second conductivity type. The first impurity region is formed in the first well, has the first conductivity type, and is electrically connected to a first electrode pad. The second impurity region is formed in the first well, is spaced apart from the first impurity region in a direction of the second well, has the second conductivity type, and is electrically connected to the first electrode pad. The third impurity region is formed in the second well, has the second conductivity type, and is electrically connected to a second electrode pad. The fourth impurity region is formed in the second well, is spaced apart from the third impurity region in a direction of the first well, has the first conductivity type, and is electrically connected to the second electrode pad. The fifth impurity region is formed in the second well, is spaced apart from the fourth impurity region in a direction of the first well, has the second conductivity type, and is electrically floated. The sixth impurity region is formed at a boundary region between the first well and the second well, has the second conductivity type, and is electrically floated. The gate is formed above the semiconductor substrate between the second impurity region and the sixth impurity region, and is electrically connected to the first electrode pad.

In exemplary embodiments, an impurity concentration of the fifth impurity region and an impurity concentration of the sixth impurity region may be higher than an impurity concentration of the second well.

In exemplary embodiments, a holding voltage of the ESD protection device may be determined based on a width of the fifth impurity region.

In exemplary embodiments, impurity concentrations of the first impurity region and the fourth impurity region may be substantially the same, and impurity concentrations of the second impurity region, the third impurity region, the fifth impurity region, and the sixth impurity region may be substantially the same.

In exemplary embodiments, the first impurity region and the fourth impurity region may be formed at the same time by a same ion implantation process, and the second impurity region, the third impurity region, the fifth impurity region, and the sixth impurity region may be formed at the same time by a same ion implantation process.

In exemplary embodiments, the first conductivity type may correspond to n-type, and the second conductivity type may correspond to p-type.

The first electrode pad may be coupled to a supply voltage, and the second electrode pad may be coupled to a ground voltage.

In exemplary embodiments, the first conductivity type may correspond to p-type, and the second conductivity type may correspond to n-type.

The first electrode pad may be coupled to a ground voltage, and the second electrode pad may be coupled to a supply voltage.

According to exemplary embodiments, an electronic device includes a functional block and an ESD protection device. The functional block is coupled between a supply voltage pad, which is coupled to a supply voltage, and a ground voltage pad, which is coupled to a ground voltage, and operates using the supply voltage. The ESD protection device is coupled between the supply voltage pad and the ground voltage pad. The ESD protection device includes a semiconductor substrate, a first well, a second well, a first impurity region, a second impurity region, a third impurity region, and a fourth impurity region. The first well is formed in the semiconductor substrate, and has a first conductivity type. The second well is formed in the semiconductor substrate, contacts the first well, and has a second conductivity type. The first impurity region is formed in the first well, and has the first conductivity type. The second impurity region is formed in the first well, is spaced apart from the first impurity region in a direction of the second well, and has the second conductivity type. The third impurity region is formed in the second well, and has the second conductivity type. The fourth impurity region is formed in the second well, is located in a direction of the first well from the third impurity region to contact the third impurity region, has the first conductivity type, and is electrically floated. When the first conductivity type corresponds to n-type and the second conductivity type corresponds to p-type, the first impurity region and the second impurity region are electrically connected to the supply voltage pad, and the third impurity region is electrically connected to the ground voltage pad. When the first conductivity type corresponds to p-type and the second conductivity type corresponds to n-type, the first impurity region and the second impurity region are electrically connected to the ground voltage pad, and the third impurity region is electrically connected to the supply voltage pad.

According to exemplary embodiments, an electronic device includes a functional block and an ESD protection device. The functional block is coupled to a supply voltage pad, which is coupled to a supply voltage, a ground voltage pad, which is coupled to a ground voltage, and a data input/output pad, and communicates data through the data input/output pad using the supply voltage. The ESD protection device is coupled between the data input/output pad and the ground voltage pad. The ESD protection device includes a semiconductor substrate, a first well, a second well, a first impurity region, a second impurity region, a third impurity region, and a fourth impurity region. The first well is formed in the semiconductor substrate, and has a first conductivity type. The second well is formed in the semiconductor substrate, contacts the first well, and has a second conductivity type. The first impurity region is formed in the first well, and has the first conductivity type. The second impurity region is formed in the first well, is spaced apart from the first impurity region in a direction of the second well, and has the second conductivity type. The third impurity region is formed in the second well, and has the second conductivity type. The fourth impurity region is formed in the second well, is located in a direction of the first well from the third impurity region to contact the third impurity region, has the first conductivity type, and is electrically floated. When the first conductivity type corresponds to n-type and the second conductivity type corresponds to p-type, the first impurity region and the second impurity region are electrically connected to the data input/output pad, and the third impurity region is electrically connected to the ground voltage pad. When the first conductivity type corresponds to p-type and the second conductivity type corresponds to n-type, the first impurity region and the second impurity region are electrically connected to the ground voltage pad, and the third impurity region is electrically connected to the data input/output pad.

In exemplary embodiments in accordance with principles of inventive concepts, an electrostatic discharge protection device includes an avalanche breakdown device including first and second wells of different conductivity types formed adjacent to one another in a substrate and configured to conduct with positive feedback through parasitic bipolar transistors when pads connected to the wells reverse-bias the wells to a breakdown voltage level; and a high-concentration impurity region formed in one well and positioned to reduce the current gain of one of the parasitic bipolar transistors to increase a holding voltage of the avalanche breakdown device.

In exemplary embodiments in accordance with principles of inventive concepts, an electrostatic discharge protection device includes a high-concentration impurity region is positioned to partially determine the holding voltage of the avalanche breakdown device according to its proximity to a high-concentration impurity region formed in the well other than the well in which it is formed.

In exemplary embodiments in accordance with principles of inventive concepts, an electrostatic discharge protection device includes a high-concentration impurity region formed at a boundary between the first and second wells to decrease the breakdown voltage level.

In exemplary embodiments in accordance with principles of inventive concepts, an electrostatic discharge protection device includes a gate that, in combination with the high concentration impurity region formed at the boundary between the first and second wells and a high concentration impurity region of the same conductivity type as that formed at the boundary forms metal oxide semiconductor transistor to reduce the breakdown voltage level.

In exemplary embodiments in accordance with principles of inventive concepts, a portable electronic device includes an electrostatic discharge protection device that includes an avalanche breakdown device including first and second wells of different conductivity types formed adjacent to one another in a substrate and configured to conduct with positive feedback through parasitic bipolar transistors when pads connected to the wells reverse-bias the wells to a breakdown voltage level; and a high-concentration impurity region formed in one well and positioned to reduce the current gain of one of the parasitic bipolar transistors to increase a holding voltage of the avalanche breakdown device.

BRIEF DESCRIPTION OF THE DRAWINGS

Illustrative, non-limiting exemplary embodiments will be more clearly understood from the following detailed description in conjunction with the accompanying drawings.

DETAILED DESCRIPTION OF THE EMBODIMENTS

Figure 1:
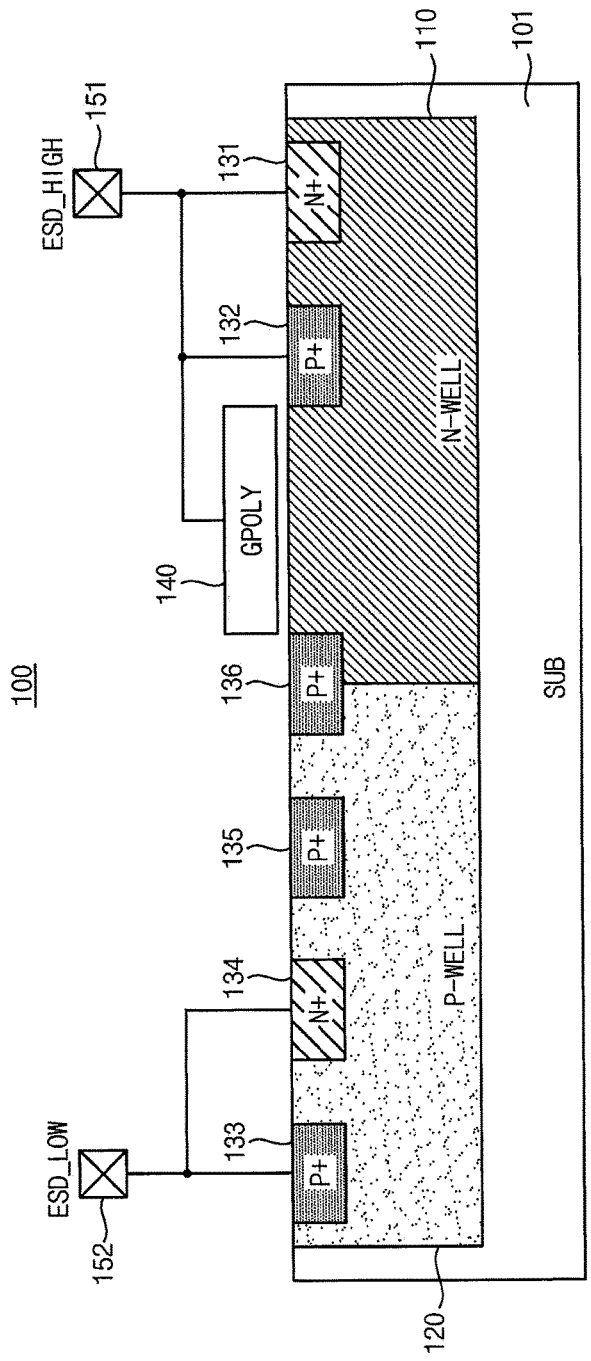
FIG. 1 is a cross-sectional view of an electrostatic discharge (ESD) protection device according to exemplary embodiments.

Various exemplary embodiments will be described more fully with reference to the accompanying drawings, in which some exemplary embodiments are shown. Inventive concepts may, however, be embodied in many different forms and should not be construed as limited to the exemplary embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In exemplary embodiments in accordance with principles of inventive concepts, an electrostatic discharge protection device includes an avalanche breakdown device including first and second wells of different conductivity types formed adjacent to one another in a substrate and configured to conduct with positive feedback through parasitic bipolar transistors when pads connected to the wells reverse-bias the wells to a breakdown voltage level.

A high-concentration impurity region may be formed in one well and positioned to reduce the current gain of one of the parasitic bipolar transistors to increase a holding voltage of the avalanche breakdown device.

A high-concentration impurity region may be positioned to partially determine the holding voltage of the avalanche breakdown device according to its proximity to a high-concentration impurity region formed in the well other than the well in which it is formed.

A high-concentration impurity region may faulted at a boundary between the first and second wells to decrease the breakdown voltage level.

A gate that, in combination with the high concentration impurity region formed at the boundary between the first and second wells and a high concentration impurity region of the same conductivity type as that formed at the boundary may be included to form metal oxide semiconductor transistor to reduce the breakdown voltage level.

In exemplary embodiments in accordance with principles of inventive concepts, a portable electronic device may include an electrostatic discharge protection device that includes an avalanche breakdown device including first and second wells of different conductivity types formed adjacent to one another in a substrate and configured to conduct with positive feedback through parasitic bipolar transistors when pads connected to the wells reverse-bias the wells to a breakdown voltage level.

A high-concentration impurity region may be formed in one well and positioned to reduce the current gain of one of the parasitic bipolar transistors to increase a holding voltage of the avalanche breakdown device.

A high-concentration impurity region may be positioned to partially determine the holding voltage of the avalanche breakdown device according to its proximity to a high-concentration impurity region formed in the well other than the well in which it is formed.

A high-concentration impurity region may formed at a boundary between the first and second wells to decrease the breakdown voltage level.

A gate that, in combination with the high concentration impurity region formed at the boundary between the first and second wells and a high concentration impurity region of the same conductivity type as that formed at the boundary may be included to form metal oxide semiconductor transistor to reduce the breakdown voltage level.

FIG. 1 is a cross-sectional view of an exemplary embodiment of an electrostatic discharge (ESD) protection device in accordance with principles of inventive concepts.

Referring to FIG. 1, an ESD protection device 100 includes a semiconductor substrate SUB 101, a first well 110, a second well 120, a first impurity region 131, a second impurity region 132, a third impurity region 133, a fourth impurity region 134, a fifth impurity region 135, a sixth impurity region 136, and a gate GPOLY 140.

The first well 110 is formed in the semiconductor substrate 101 and is of a first conductivity type (also referred to herein as conductive type).

The second well 120 is formed in the semiconductor substrate 101 to contact the first well 110 and is of a second conductivity type.

In some exemplary embodiments, the first conductivity type may correspond to n-type, and the second conductivity type may correspond to p-type. In such exemplary embodiments, the first well 110 may correspond to an n-well and the second well 120 may correspond to a p-well.

Hereinafter, the first conductivity type is assumed to be n-type and the second conductivity type is assumed to be p-type.

In this exemplary embodiment, first impurity region N+ 131 is formed in the first well 110 and is n-type. In some exemplary embodiments, an impurity concentration of the first impurity region 131 may be higher than an impurity concentration of the first well 110.

In this exemplary embodiment, second impurity region P+ 132 is formed in the first well 110; is spaced apart from the first impurity region 131 in a direction of the second well 120, and is p-type. In some exemplary embodiments, an impurity concentration of the second impurity region 132 may be higher than an impurity concentration of the second well 120.

In this exemplary embodiment, third impurity region P+ 133 is formed in the second well 120 and is p-type. In some exemplary embodiments, an impurity concentration of the third impurity region 133 may be higher than the impurity concentration of the second well 120.

In this exemplary embodiment, fourth impurity region N+ 134 is formed in the second well 120, is spaced apart from the third impurity region 133 in a direction of the first well 110, and is n-type. In some exemplary embodiments, an impurity concentration of the fourth impurity region 134 may be higher than the impurity concentration of the first well 110.

In this exemplary embodiment, fifth impurity region P+ 135 is formed in the second well 120, is spaced apart from the fourth impurity region 134 in a direction of the first well 110, and is p-type. In some exemplary embodiments, an impurity concentration of the fifth impurity region 135 may be higher than the impurity concentration of the second well 120.

In this exemplary embodiment, sixth impurity region P+ 136 is formed at a boundary region between the first well 110 and the second well 120, is spaced apart from the second impurity region 132 and the fifth impurity region 135, and is p-type. In some exemplary embodiments, an impurity concentration of the sixth impurity region 136 may be higher than the impurity concentration of the second well 120.

In some exemplary embodiments, the first impurity region 131 and the fourth impurity region 134 may be formed at the same time by the same ion implantation process. In such exemplary embodiments, the impurity concentrations of the first impurity region 131 and the fourth impurity region 134 may be substantially the same.

In some exemplary embodiments, the second impurity region 132, the third impurity region 133, the fifth impurity region 135, and the sixth impurity region 136 may be formed at the same time by a same ion implantation process. In such exemplary embodiments, the impurity concentrations of the second impurity region 132, the third impurity region 133, the fifth impurity region 135, and the sixth impurity region 136 may be substantially the same.

In exemplary embodiments, gate 140 is formed above the semiconductor substrate 101 between the second impurity region 132 and the sixth impurity region 136. In some exemplary embodiments, the gate 140 may include polysilicon.

The first impurity region 131, the second impurity region 132, and the gate 140 may be electrically connected to a first electrode pad ESD_HIGH 151. The third impurity region 133 and the fourth impurity region 134 may be electrically connected to a second electrode pad ESD_LOW 152.

The fifth impurity region 135 and the sixth impurity region 136 may be electrically floated.

In exemplary embodiments, in operation, first electrode pad 151 may be coupled to a relatively high voltage, and the second electrode pad 152 may be coupled to a relatively low voltage. In some exemplary embodiments, the first electrode pad 151 may be coupled to a supply voltage, and the second electrode pad 152 may be coupled to a ground voltage. In other exemplary embodiments, the first electrode pad 151 may be coupled to a data input/output pin, and the second electrode pad 152 may be coupled to the ground voltage.

As will be described in greater detail later, when an ESD event occurs such that a plurality of positive charges (or, simply, positive charge) flow in the ESD protection device 100 through the first electrode pad 151, the ESD protection device 100 may be turned on to discharge the positive charges to the second electrode pad 152.

Figure 2:
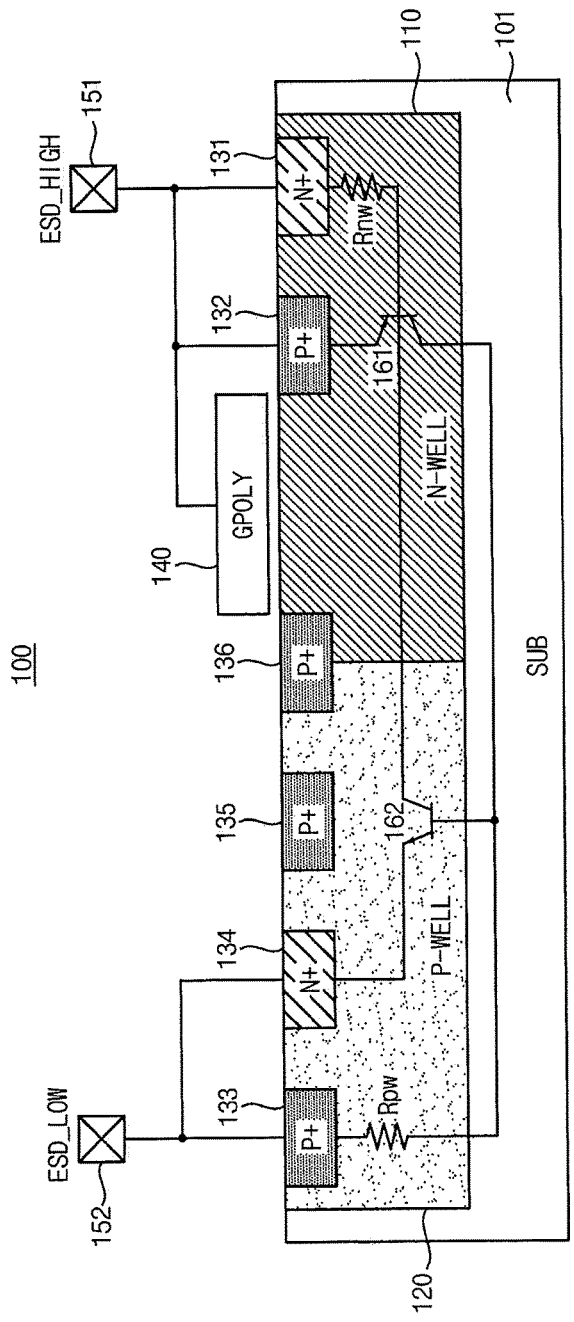
FIG. 2 is a diagram illustrating a bipolar junction transistor (BJT) parasitically formed in the ESD protection device of FIG. 1.
Figure 3:
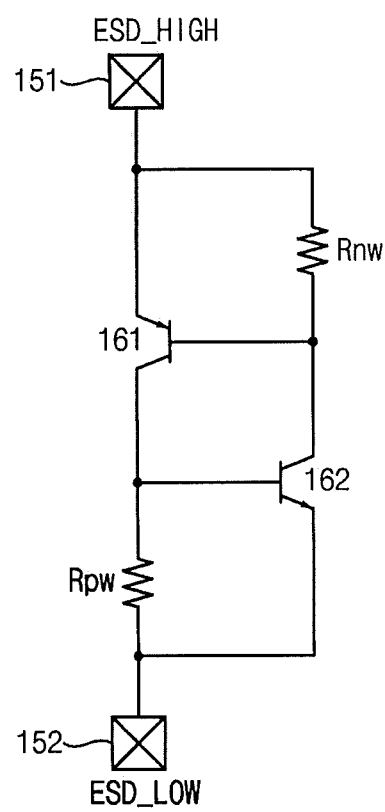
FIG. 3 is a circuit diagram illustrating an equivalent circuit of the ESD protection device of FIG. 1.

FIG. 2 is a diagram illustrating a bipolar junction transistor (BJT) parasitically formed in the ESD protection device of FIG. 1. FIG. 3 is a circuit diagram illustrating an equivalent circuit of the ESD protection device of FIG. 1.

Referring to FIG. 2, a PNP bipolar junction transistor (BJT) 161 may be parasitically formed in the ESD protection device 100. An emitter of the PNP BJT 161 may correspond to the second impurity region 132, a base of the PNP BJT 161 may correspond to the first well 110, and a collector of the PNP BJT 161 may correspond to the second well 120 and the third impurity region 133.

In addition, an NPN BJT 162 may be parasitically formed in the ESD protection device 100. A collector of the NPN BJT 162 may correspond to the first impurity region 131 and the first well 110, a base of the NPN BJT 162 may correspond to the second well 120, and an emitter of the NPN BJT 162 may correspond to the fourth impurity region 134.

In FIG. 2, the resistance of the first well 110 is represented as an n-well resistor Rnw, and the resistance of the second well 120 is represented as a p-well resistor Rpw.

In this manner, an equivalent circuit of the ESD protection device 100 of FIG. 1 may be represented as a circuit diagram of FIG. 3.

Hereinafter, operation of the ESD protection device 100 will be described with reference to FIGS. 1 to 3.

When an ESD event occurs, positive charge may flow in the ESD protection device 100 through the first electrode pad 151. Because the positive charge is transferred to the first well 110, an electric potential of the first well 110 may increase as the amount of positive charge flowing in the ESD protection device 100 through the first electrode pad 151 increases. Therefore, the first well 110 and the second well 120 may be in a reverse biased state. When the electric potential of the first well 110 increases such that an electric potential difference between the first well 110 and the second well 120 reaches a breakdown voltage, an avalanche breakdown may occur at a junction of the first well 110 and the second well 120.

When the avalanche breakdown occurs, electron-hole pairs may be generated and holes of the electron-hole pairs may be transferred to the second well 120 to increase an electric potential of the second well 120. When the electric potential of the second well 120 increases such that an electric potential difference between the second well 120 and the fourth impurity region 134 becomes greater than a threshold voltage of the NPN BJT 162, the NPN BJT 162 may be turned on.

When the NPN BJT 162 is turned on, a current may flow from the first electrode pad 151 to the second electrode pad 152 through the first impurity region 131, the first well 110, the second well 120, and the fourth impurity region 134. While the current flows through the first well 110, a voltage drop may occur at the first well 110 by the n-well resistor Rnw. Therefore, the electric potential of the first well 110 may become lower than an electrical potential of the second impurity region 132, such that the PNP BJT 161 may be turned on.

When the PNP BJT 161 is turned on, a current may flow from the first electrode pad 151 to the second electrode pad 152 through the second impurity region 132, the first well 110, the second well 120, and the third impurity region 133. While the current flows through the second well 120, a voltage drop may occur at the second well 120 by the p-well resistor Rpw. Therefore, the electric potential of the second well 120 may be maintained higher than an electrical potential of the fourth impurity region 134, such that the NPN BJT 162 may be turned on more strongly.

As described above, when an ESD event occurs such that positive charge flows in the ESD protection device 100 through the first electrode pad 151, the PNP BJT 161 and the NPN BJT 162 may be maintained in a turned on state through positive feedback. Therefore, when the ESD event occurs such that positive charge flows in the ESD protection device 100 through the first electrode pad 151, the ESD protection device 100 may be turned on to discharge the positive charge to the second electrode pad 152.

A conventional silicon controlled rectifier (SCR) does not include the fifth impurity region 135, the sixth impurity region 136, and the gate 140.

As will be described in greater detail below, a triggering voltage of the conventional SCR is relatively high and a holding voltage of the conventional SCR is relatively low. Unlike a conventional SCR, the ESD protection device 100 according to exemplary embodiments of inventive concepts may include the sixth impurity region 136, which is formed at a boundary region between the first well 110 and the second well 120, and, because the impurity concentration of the sixth impurity region 136 is higher than the impurity concentration of the second well 120, the breakdown voltage, at which an avalanche breakdown occurs at a junction of the first well 110 and the second well 120, may decrease because of the sixth impurity region 136. As a result, the triggering voltage of the ESD protection device 100 may be lower than that of a conventional ESD protection device.

In addition, the ESD protection device 100 according to exemplary embodiments may include the gate 140, which is formed above the semiconductor substrate 101 between the second impurity region 132 and the sixth impurity region 136, and is electrically connected to the first electrode pad 151. Because the second impurity region 132, the sixth impurity region 136, and the gate 140 form a metal oxide semiconductor (MOS) transistor, the breakdown voltage, at which an avalanche breakdown occurs at a junction of the first well 110 and the second well 120, may be similar to a breakdown voltage of the MOS transistor. As such, a triggering voltage of an ESD protection device 100 in accordance with principles of inventive concepts may further decrease.

In addition, the ESD protection device 100 according to exemplary embodiments may include the fifth impurity region 135, which is formed in the second well 120 to be spaced apart from the fourth impurity region 134 in a direction of the first well 110. As a result, a distance between the first well 110 and the fifth impurity region 135 may be smaller than a distance between the first well 110 and the third impurity region 133. As such, when the PNP BJT 161 is turned on, a portion of the current, which flows from the first electrode pad 151 to the second electrode pad 152 through the second impurity region 132, the first well 110, the second well 120, and the third impurity region 133, may be leaked to the fifth impurity region 135, such that a current gain of the PNP BJT 161 may decrease. Because the holding voltage of the ESD protection device 100 is inversely proportional to the current gain of the PNP BJT 161, the holding voltage of the ESD protection device 100 may increase.

Figure 4:
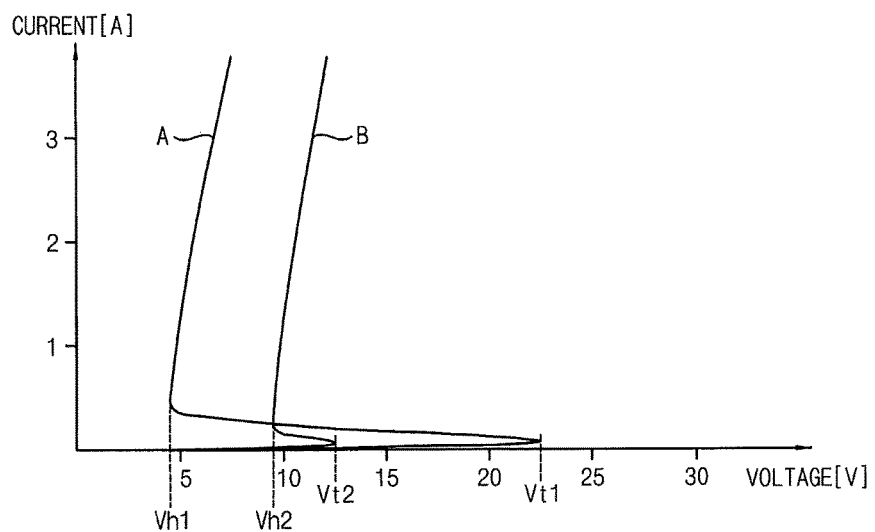
FIG. 4 is a graph illustrating voltage-current characteristics of the ESD protection device of FIG. 1.

FIG. 4 is a graph illustrating voltage-current characteristics of an ESD protection device in accordance with principles of inventive concepts such as that of the exemplary embodiment of FIG. 1.

In FIG. 4, the x-axis represents a voltage of the first electrode pad 151, and the y-axis represents a current flowing from the first electrode pad 151 to the ESD protection device 100.

In FIG. 4, first graph A represents voltage-current characteristics of a conventional SCR, and second graph B represents voltage-current characteristics of ESD protection device 100 in accordance with principles of inventive concepts.

As illustrated in FIG. 4, the conventional SCR, which does not include the fifth impurity region 135, the sixth impurity region 136, and the gate 140, has a relatively high triggering voltage Vt1 and a relatively low holding voltage Vh1. On the other hand, the ESD protection device 100 in accordance with principles of inventive concepts has a relatively low triggering voltage Vt2 and a relatively high holding voltage Vh2.

As the width of the fifth impurity region 135 increases, the amount of current leaked to the fifth impurity region 135 among the current flowing from the first electrode pad 151 to the second electrode pad 152 through the second impurity region 132, the first well 110, the second well 120, and the third impurity region 133 when the PNP BJT 161 is turned on may increase. Therefore, as the width of the fifth impurity region 135 increases, the current gain of the PNP BJT 161 may decrease such that the holding voltage of the ESD protection device 100 may increase.

Similarly, as the width of the fifth impurity region 135 decreases, the amount of current leaked to the fifth impurity region 135 among the current flowing from the first electrode pad 151 to the second electrode pad 152 through the second impurity region 132, the first well 110, the second well 120, and the third impurity region 133 when the PNP BJT 161 is turned on may decrease. Therefore, as the width of the fifth impurity region 135 decreases, the current gain of the PNP BJT 161 may increase such that the holding voltage of the ESD protection device 100 may decrease.

Therefore, in accordance with principles of inventive concepts, the holding voltage of the ESD protection device 100 may be established, based on the width of the fifth impurity region 135.

Figure 5:
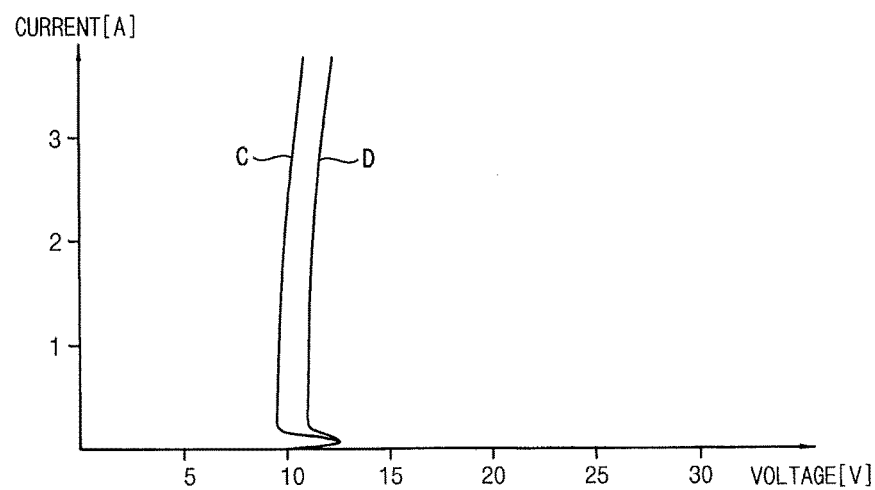
FIG. 5 is a graph illustrating a variation of a holding voltage of the ESD protection device of FIG. 1 according to a width of a fifth impurity region.

FIG. 5 is a graph illustrating a variation of a holding voltage of the ESD protection device of FIG. 1 according to the width of a fifth impurity region.

In FIG. 5, the x-axis represents a voltage of the first electrode pad 151, and the y-axis represents a current flowing from the first electrode pad 151 to the ESD protection device 100.

In FIG. 5, a first graph C represents a holding voltage of the ESD protection device 100 when the width of the fifth impurity region 135 is relatively short (or small), and a second graph D represents a holding voltage of the ESD protection device 100 when the width of the fifth impurity region 135 is relatively long (or large).

As illustrated in FIG. 5, the holding voltage of the ESD protection device 100 in accordance with principles of inventive concepts may increase as the width of the fifth impurity region 135 increases, and the holding voltage of the ESD protection device 100 may decrease as the width of the fifth impurity region 135 decreases.

As described above with reference to FIGS. 1 to 5, because the ESD protection device 100 according to exemplary embodiments includes the fifth impurity region 135, the sixth impurity region 136, and the gate 140, the ESD protection device 100 may have a relatively low triggering voltage and a relatively high holding voltage. In addition, the holding voltage of the ESD protection device 100 may be adjusted by controlling the width of the fifth impurity region 135.

Figure 6:
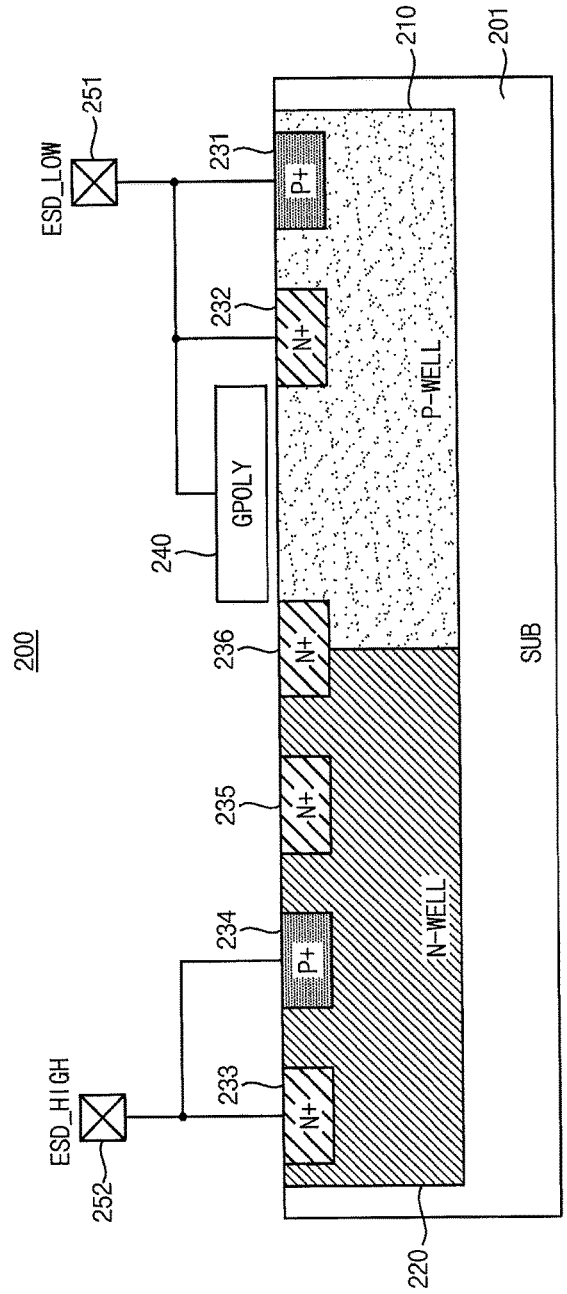
FIG. 6 is a cross-sectional view of an ESD protection device according to exemplary embodiments.

FIG. 6 is a cross-sectional view of an exemplary embodiment of an ESD protection device in accordance with principles of inventive concepts.

Referring to FIG. 6, an ESD protection device 200 includes a semiconductor substrate SUB 201, a first well 210, a second well 220, a first impurity region 231, a second impurity region 232, a third impurity region 233, a fourth impurity region 234, a fifth impurity region 235, a sixth impurity region 236, and a gate GPOLY 240.

The first well 210 is formed in the semiconductor substrate 201 and is of a first conductivity type.

The second well 220 is formed in the semiconductor substrate 201 to contact the first well 210 and is of a second conductivity type.

In some exemplary embodiments, the first conductivity type may be a p-type, and the second conductivity type may be an n-type. In such exemplary embodiments, the first well 210 may be a p-well, and the second well 220 may be an n-well.

Hereinafter, the first conductivity type is assumed to be p-type, and the second conductivity type is assumed to be n-type.

The first impurity region P+ 231 is formed in the first well 210 and is of p-type. In some exemplary embodiments, an impurity concentration of the first impurity region 231 may be higher than an impurity concentration of the first well 210.

The second impurity region N+ 232 is formed in the first well 210, is spaced apart from the first impurity region 231 in a direction of the second well 220 and is of n-type. In some exemplary embodiments, an impurity concentration of the second impurity region 232 may be higher than an impurity concentration of the second well 220.

The third impurity region N+ 233 is formed in the second well 220 and is of n-type. In some exemplary embodiments, an impurity concentration of the third impurity region 233 may be higher than the impurity concentration of the second well 220.

The fourth impurity region P+ 234 is formed in the second well 220, is spaced apart from the third impurity region 233 in a direction of the first well 210, and is of p-type. In some exemplary embodiments, an impurity concentration of the fourth impurity region 234 may be higher than the impurity concentration of the first well 210.

The fifth impurity region N+ 235 is faulted in the second well 220, is spaced apart from the fourth impurity region 234 in a direction of the first well 210, and is of n-type. In some exemplary embodiments, an impurity concentration of the fifth impurity region 235 may be higher than the impurity concentration of the second well 220.

The sixth impurity region N+ 236 is formed at a boundary region between the first well 210 and the second well 220, is spaced apart from the second impurity region 232 and the fifth impurity region 235, and is of n-type. In some exemplary embodiments, an impurity concentration of the sixth impurity region 236 may be higher than the impurity concentration of the second well 220.

In some exemplary embodiments, the first impurity region 231 and the fourth impurity region 234 may be formed at the same time by in the same ion implantation process. As a result, the impurity concentrations of the first impurity region 231 and the fourth impurity region 234 may be substantially the same.

In some exemplary embodiments, the second impurity region 232, the third impurity region 233, the fifth impurity region 235, and the sixth impurity region 236 may be formed at the same time by a same ion implantation process and, as a result, the impurity concentrations of the second impurity region 232, the third impurity region 233, the fifth impurity region 235, and the sixth impurity region 236 may be substantially the same.

The gate 240 is formed above the semiconductor substrate 201 between the second impurity region 232 and the sixth impurity region 236. In some exemplary embodiments, the gate 240 may include polysilicon.

The first impurity region 231, the second impurity region 232, and the gate 240 may be electrically connected to a first electrode pad ESD_LOW 251. The third impurity region 233 and the fourth impurity region 234 may be electrically connected to a second electrode pad ESD_HIGH 252.

The fifth impurity region 235 and the sixth impurity region 236 may be electrically floated.

The first electrode pad 251 may be coupled to a relatively low voltage, and the second electrode pad 252 may be coupled to a relatively high voltage. In some exemplary embodiments, the first electrode pad 251 may be coupled to a ground voltage, and the second electrode pad 252 may be coupled to a supply voltage. In other exemplary embodiments, the first electrode pad 251 may be coupled to the ground voltage, and the second electrode pad 252 may be coupled to a data input/output pin.

As will be described in greater detail later, when an ESD event occurs such that positive charge flows in the ESD protection device 200 through the second electrode pad 252, the ESD protection device 200 may be turned on to discharge the positive charge to the first electrode pad 251.

Figure 7:
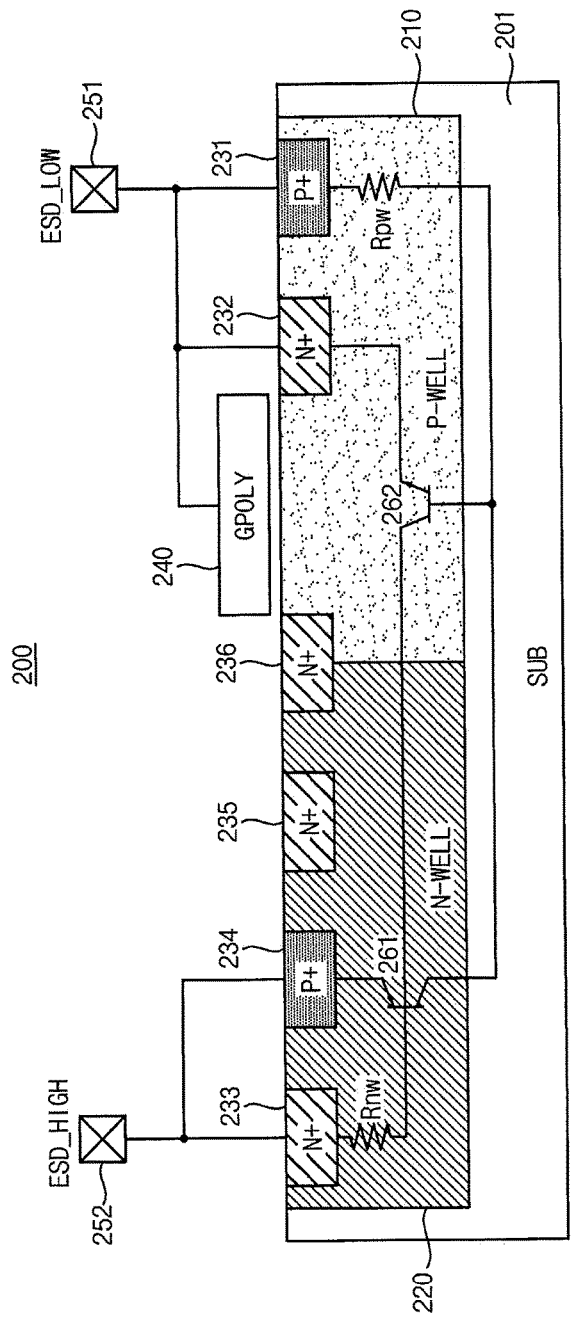
FIG. 7 is a diagram illustrating a BJT parasitically formed in the ESD protection device of FIG. 6.
Figure 8:
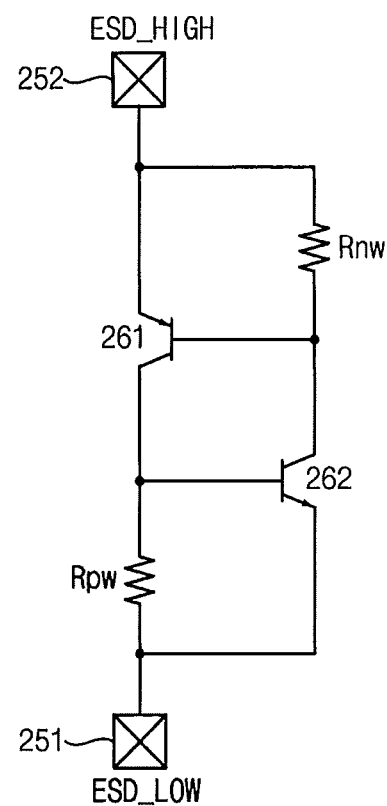
FIG. 8 is a circuit diagram illustrating an equivalent circuit of the ESD protection device of FIG. 6.

FIG. 7 is a diagram illustrating a BJT parasitically formed in the ESD protection device of FIG. 6. FIG. 8 is a circuit diagram illustrating an equivalent circuit of the ESD protection device of FIG. 6.

Referring to FIG. 7, a PNP BJT 261 may be parasitically formed in the ESD protection device 200. An emitter of the PNP BJT 261 may correspond to the fourth impurity region 234, a base of the PNP BJT 261 may correspond to the second well 220, and a collector of the PNP BJT 261 may correspond to the first well 210 and the first impurity region 231.

Additionally, an NPN BJT 262 may be parasitically formed in the ESD protection device 200. A collector of the NPN BJT 262 may correspond to the third impurity region 233 and the second well 220, a base of the NPN BJT 262 may correspond to the first well 210, and an emitter of the NPN BJT 262 may correspond to the second impurity region 232.

In the exemplary embodiment of FIG. 7, resistance of the first well 210 is represented as a p-well resistor Rpw, and resistance of the second well 220 is represented as an n-well resistor Rnw.

Therefore, an equivalent circuit of the ESD protection device 200 of FIG. 6 may be represented as a circuit diagram of FIG. 8.

Hereinafter, an exemplary operation of the ESD protection device 200 will be described with reference to FIGS. 6 to 8.

When an ESD event occurs, positive charge may flow in the ESD protection device 200 through the second electrode pad 252. Because the positive charge is transferred to the second well 220, an electric potential of the second well 220 may increase according to the amount of positive charge flowing in the ESD protection device 200 through the second electrode pad 252 increases. As a result, the first well 210 and the second well 220 may be in a reverse biased state. When the electric potential of the second well 220 increases such that an electric potential difference between the first well 210 and the second well 220 reaches a breakdown voltage, an avalanche breakdown may occur at a junction of the first well 210 and the second well 220.

When the avalanche breakdown occurs, electron-hole pairs may be generated and holes of the electron-hole pairs may be transferred to the first well 210 to increase an electric potential of the first well 210. When the electric potential of the first well 210 increases such that an electric potential difference between the first well 210 and the second impurity region 232 becomes greater than a threshold voltage of the NPN BJT 262, the NPN BJT 262 may be turned on.

When the NPN BJT 262 is turned on, a current may flow from the second electrode pad 252 to the first electrode pad 251 through the third impurity region 233, the second well 220, the first well 210, and the second impurity region 232. While the current flows through the second well 220, a voltage drop may occur at the second well 220 across the n-well resistor Rnw. As a result, the electric potential of the second well 220 may become lower than an electrical potential of the fourth impurity region 234, such that the PNP BJT 261 may be turned on.

When the PNP BJT 261 is turned on, a current may flow from the second electrode pad 252 to the first electrode pad 251 through the fourth impurity region 234, the second well 220, the first well 210, and the first impurity region 231. While the current flows through the first well 210, a voltage drop may occur at the first well 210 across the p-well resistor Rpw. As a result, the electric potential of the first well 210 may be maintained at a higher potential than the electrical potential of the second impurity region 232, with the result that the NPN BJT 262 may be turned on more strongly.

As described above, when an ESD event occurs, resulting in positive charge flow in the ESD protection device 200 through the second electrode pad 252, the PNP BJT 261 and the NPN BJT 262 may be maintained in a turned on state through positive feedback. As a result, when the ESD event occurs, resulting in positive charge flow in the ESD protection device 200 through the second electrode pad 252, the ESD protection device 200 may be turned on to discharge positive charge to the first electrode pad 251.

A conventional silicon controlled rectifier (SCR) does not include the fifth impurity region 235, the sixth impurity region 236, and the gate 240 and, as will be described in greater detail below, a triggering voltage of a conventional SCR is relatively high and a holding voltage of a conventional SCR is relatively low.

In contrast, an ESD protection device in accordance with principles of inventive concepts, such as ESD protection device 200 according to exemplary embodiments may include the sixth impurity region 236, which is formed at a boundary region between the first well 210 and the second well 220. Because the impurity concentration of the sixth impurity region 236 is higher than the impurity concentration of the second well 220, the breakdown voltage, at which an avalanche breakdown occurs at a junction of the first well 210 and the second well 220, may decrease because of the sixth impurity region 236. As a result, a triggering voltage of the ESD protection device 200 may decrease, in accordance with principles of inventive concepts.

Additionally, in an ESD protection device in accordance with principles of inventive concepts, such as ESD protection device 200 according to exemplary embodiments may include the gate 240, which is formed above the semiconductor substrate 201 between the second impurity region 232 and the sixth impurity region 236, and is electrically connected to the first electrode pad 251. Because the second impurity region 232, the sixth impurity region 236, and the gate 240 form a metal oxide semiconductor (MOS) transistor, the breakdown voltage, at which an avalanche breakdown occurs at a junction of the first well 210 and the second well 220, may be similar to a breakdown voltage of the MOS transistor. As a result, a triggering voltage of the ESD protection device 200 may further decrease.

Furthermore, an ESD protection device in accordance with principles of inventive concepts, such as the ESD protection device 200 according to exemplary embodiments may include the fifth impurity region 235, which is formed in the second well 220 to be spaced apart from the fourth impurity region 234 in a direction of the first well 210. As a result, a distance between the first well 210 and the fifth impurity region 235 may be smaller than a distance between the first well 210 and the third impurity region 233. As a result, when the NPN BJT 262 is turned on, a portion of the current, which flows from the second electrode pad 252 to the first electrode pad 251 through the third impurity region 233, the second well 220, the first well 210, and the second impurity region 232, may be leaked to the fifth impurity region 235, so that a current gain of the NPN BJT 262 may decrease. Because a holding voltage of the ESD protection device 200 is inversely proportional to the current gain of the NPN BJT 262, the holding voltage of the ESD protection device 200 may increase.

As a width of the fifth impurity region 235 increases, the amount of a current leaked to the fifth impurity region 235 among the current flowing from the second electrode pad 252 to the first electrode pad 251 through the third impurity region 233, the second well 220, the first well 210, and the second impurity region 232 when the NPN BJT 262 is turned on may increase. Therefore, as the width of the fifth impurity region 235 increases, the current gain of the NPN BJT 262 may decrease and, as a result, the holding voltage of the ESD protection device 200 may increase.

Similarly, as a width of the fifth impurity region 235 decreases, the amount of current leaked to the fifth impurity region 235 among the current flowing from the second electrode pad 252 to the first electrode pad 251 through the third impurity region 233, the second well 220, the first well 210, and the second impurity region 232 when the NPN BJT 262 is turned on may decrease. As a result, as the width of the fifth impurity region 235 decreases, the current gain of the NPN BJT 262 may increase such that the holding voltage of the ESD protection device 200 may decrease and the holding voltage of the ESD protection device 200 may be determined based on the width of the fifth impurity region 235.

The ESD protection device 200 of FIG. 6 is the same as the ESD protection device 100 of FIG. 1 except that conductivity types of the first well 210, the second well 220, the first impurity region 231, the second impurity region 232, the third impurity region 233, the fourth impurity region 234, the fifth impurity region 235, and the sixth impurity region 236 of the ESD protection device 200 of FIG. 6 are opposite to conductivity types of the first well 110, the second well 120, the first impurity region 131, the second impurity region 132, the third impurity region 133, the fourth impurity region 134, the fifth impurity region 135, and the sixth impurity region 136 of the ESD protection device 100 of FIG. 1, respectively. Therefore, voltage-current characteristics of the ESD protection device 200 may be similar to voltage-current characteristics of the ESD protection device 100 illustrated in FIGS. 4 and 5.

Figure 9:
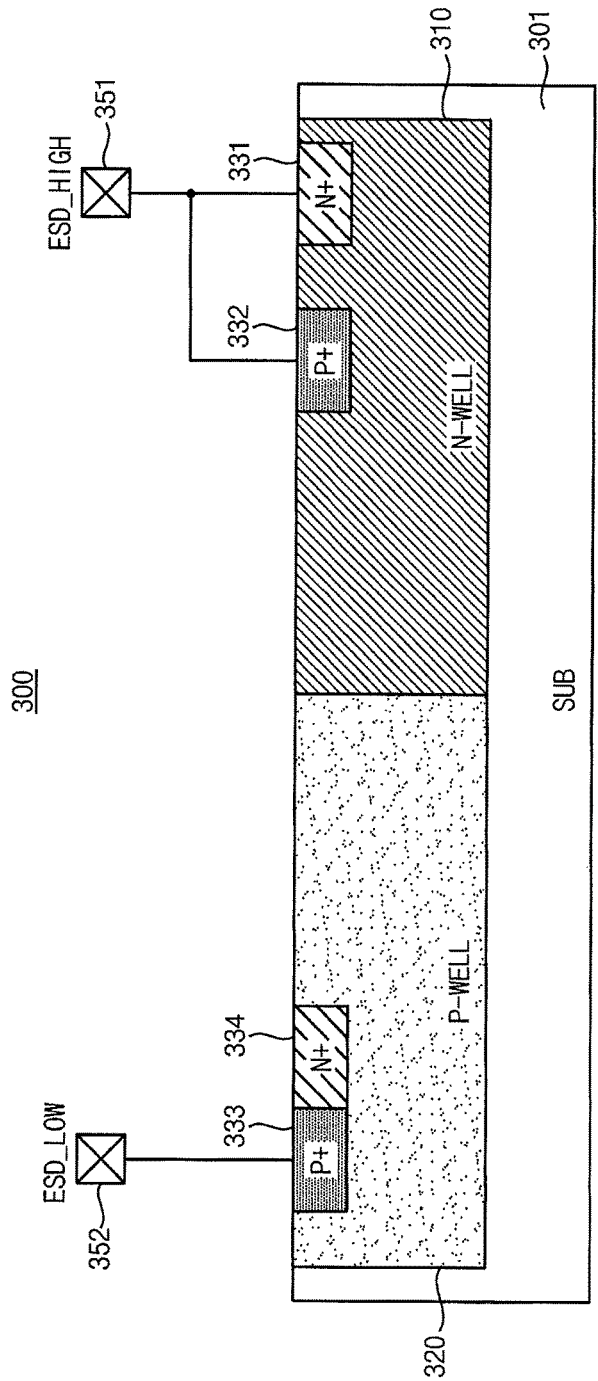
FIG. 9 is a cross-sectional view of an ESD protection device according to exemplary embodiments.

FIG. 9 is a cross-sectional view of an ESD protection device according to exemplary embodiments.

Referring to FIG. 9, an ESD protection device 300 includes a semiconductor substrate SUB 301, a first well 310, a second well 320, a first impurity region 331, a second impurity region 332, a third impurity region 333, and a fourth impurity region 334.

The first well 310 is formed in the semiconductor substrate 301 and has a first conductivity type.

The second well 320 is formed in the semiconductor substrate 301 to contact the first well 310 and has a second conductivity type.

In some exemplary embodiments, the first conductivity type may be n-type, and the second conductivity type may be p-type. In such exemplary embodiments, the first well 310 may be an n-well, and the second well 320 may be a p-well.

For the following description, the first conductivity type is assumed to be n-type, and the second conductivity type is assumed to be p-type.

The first impurity region N+ 331 is formed in the first well 310 and is of n-type. In some exemplary embodiments, an impurity concentration of the first impurity region 331 may be higher than an impurity concentration of the first well 310.

The second impurity region P+ 332 is formed in the first well 310, is spaced apart from the first impurity region 331 in a direction of the second well 320, and is of p-type. In some exemplary embodiments, an impurity concentration of the second impurity region 332 may be higher than an impurity concentration of the second well 320.

The third impurity region P+ 333 is formed in the second well 320, and is of p-type. In some exemplary embodiments, an impurity concentration of the third impurity region 333 may be higher than the impurity concentration of the second well 320.

The fourth impurity region N+ 334 is formed in the second well 320, is located in a direction of the first well 310 from the third impurity region 333 and contacts the third impurity region 333, and is of n-type. In some exemplary embodiments, an impurity concentration of the fourth impurity region 334 may be higher than the impurity concentration of the first well 310.

The first impurity region 331 and the second impurity region 332 may be electrically connected to a first electrode pad ESD_HIGH 351. The third impurity region 333 may be electrically connected to a second electrode pad ESD_LOW 352.

The fourth impurity region 334 may be electrically floated.

The first electrode pad 351 may be coupled to a relatively high voltage, and the second electrode pad 352 may be coupled to a relatively low voltage. In some exemplary embodiments, the first electrode pad 351 may be coupled to a supply voltage, and the second electrode pad 352 may be coupled to a ground voltage. In other exemplary embodiments, the first electrode pad 351 may be coupled to a data input/output pin, and the second electrode pad 352 may be coupled to the ground voltage.

As will be described in greater detail later, when an ESD event occurs such that positive charge flows in the ESD protection device 300 through the first electrode pad 351, the ESD protection device 300 may be turned on to discharge the positive charges to the second electrode pad 352.

Figure 10:
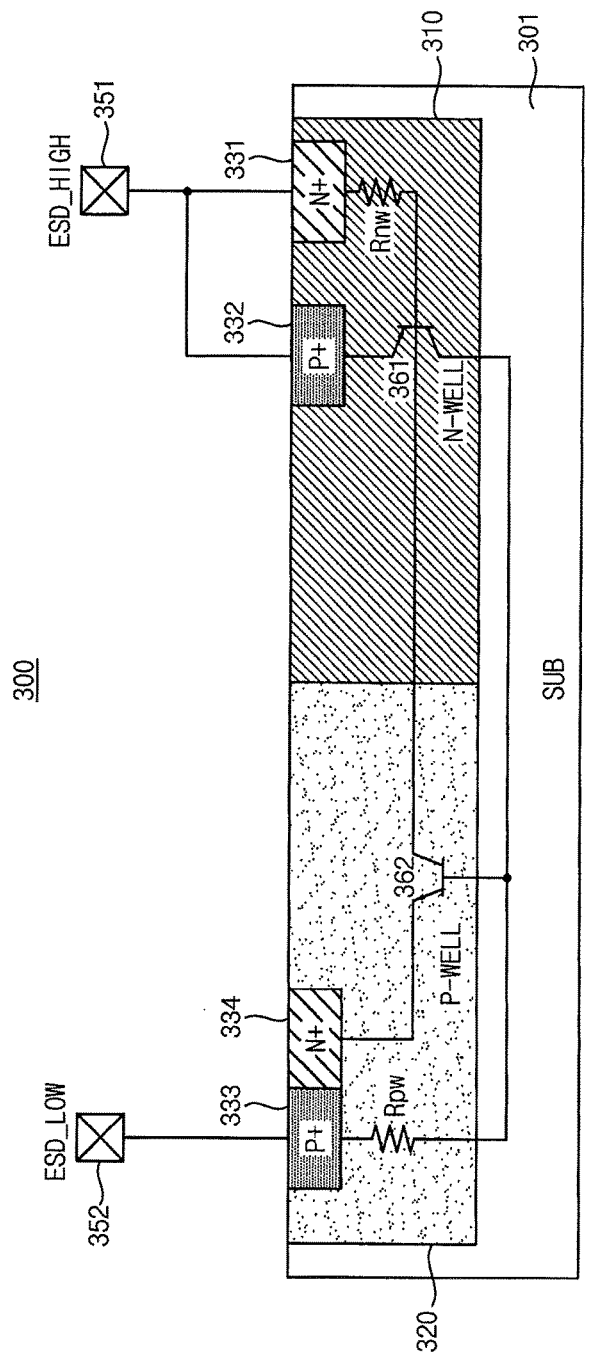
FIG. 10 is a diagram illustrating a BJT parasitically formed in the ESD protection device of FIG. 9.
Figure 11:
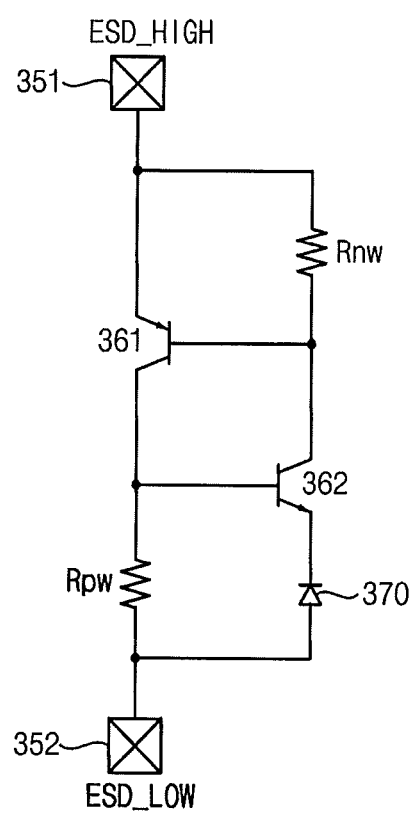
FIG. 11 is a circuit diagram illustrating an equivalent circuit of the ESD protection device of FIG. 9.

FIG. 10 is a diagram illustrating a BJT parasitically formed in the ESD protection device of FIG. 9. FIG. 11 is a circuit diagram illustrating an equivalent circuit of the ESD protection device of FIG. 9.

Referring to FIG. 10, a PNP BJT 361 may be parasitically formed in the ESD protection device 300. An emitter of the PNP BJT 361 may correspond to the second impurity region 332, a base of the PNP BJT 361 may correspond to the first well 310, and a collector of the PNP BJT 361 may correspond to the second well 320 and the third impurity region 333.

In addition, an NPN BJT 362 may be parasitically formed in the ESD protection device 300. A collector of the NPN BJT 362 may correspond to the first impurity region 331 and the first well 310, a base of the NPN BJT 362 may correspond to the second well 320, and an emitter of the NPN BJT 362 may correspond to the fourth impurity region 334.

In FIG. 10, resistance of the first well 310 is represented as an n-well resistor Rnw, and resistance of the second well 320 is represented as a p-well resistor Rpw and an equivalent circuit of the ESD protection device 300 of FIG. 9 may be represented as a circuit diagram of FIG. 11.

As illustrated in FIG. 10, the fourth impurity region 334, which corresponds to the emitter of the NPN BJT 362, may not be electrically connected to the second electrode pad 352 directly but, rather, may be electrically connected to the second electrode pad 352 through the third impurity region 333, which contacts the fourth impurity region 334. The third impurity region 333 of p-type and the fourth impurity region 334 of n-type, which contact each other, may operate as a diode. As a result, as illustrated in FIG. 11, the equivalent circuit of the ESD protection device 300 of FIG. 9 may include a diode 370 coupled between the emitter of the NPN BJT 362 and the second electrode pad 352.

Hereinafter, operation of the ESD protection device 300 will be described with reference to FIGS. 9 to 11.

When an ESD event occurs, positive charge may flow in the ESD protection device 300 through the first electrode pad 351. Because the positive charge is transferred to the first well 310, an electric potential of the first well 310 may increase as the amount of positive charge flowing in the ESD protection device 300 through the first electrode pad 351 increases. As a result, the first well 310 and the second well 320 may be in a reverse biased state. When the electric potential of the first well 310 increases such that an electric potential difference between the first well 310 and the second well 320 reaches a breakdown voltage, an avalanche breakdown may occur at a junction of the first well 310 and the second well 320.

When the avalanche breakdown occurs, electron-hole pairs may be generated and holes of the electron-hole pairs may be transferred to the second well 320 to increase an electric potential of the second well 320. When the electric potential of the second well 320 increases such that an electric potential difference between the second well 320 and the fourth impurity region 334 becomes greater than a threshold voltage of the NPN BJT 362, the NPN BJT 362 may be turned on.

When the NPN BJT 362 is turned on, a current may flow from the first electrode pad 351 to the second electrode pad 352 through the first impurity region 331, the first well 310, the second well 320, the fourth impurity region 334, and the third impurity region 333. While the current flows through the first well 310, a voltage drop may occur at the first well 310 across the n-well resistor Rnw. As a result, the electric potential of the first well 310 may become lower than an electrical potential of the second impurity region 332, such that the PNP BJT 361 may be turned on.

When the PNP BJT 361 is turned on, a current may flow from the first electrode pad 351 to the second electrode pad 352 through the second impurity region 332, the first well 310, the second well 320, and the third impurity region 333. While the current flows through the second well 320, a voltage drop may occur at the second well 320 across the p-well resistor Rpw. As a result, the electric potential of the second well 320 may be maintained higher than an electrical potential of the fourth impurity region 334, such that the NPN BJT 362 may be turned on more strongly.

As described above, when an ESD event occurs such that positive charge flows in the ESD protection device 300 through the first electrode pad 351, the PNP BJT 361 and the NPN BJT 362 may be maintained in a turned on state through a positive feedback. As a result, when the ESD event occurs such that positive charge flows in the ESD protection device 300 through the first electrode pad 351, the ESD protection device 300 may be turned on to discharge the positive charges to the second electrode pad 352.

As described above with reference to FIGS. 10 and 11, because the ESD protection device 300 includes the diode 370 coupled between the emitter of the NPN BJT 362 and the second electrode pad 352, a current gain of the NPN BJT 362 may decrease because of the diode 370. As a result, a holding voltage of the ESD protection device 300 may increase.

Figure 12:
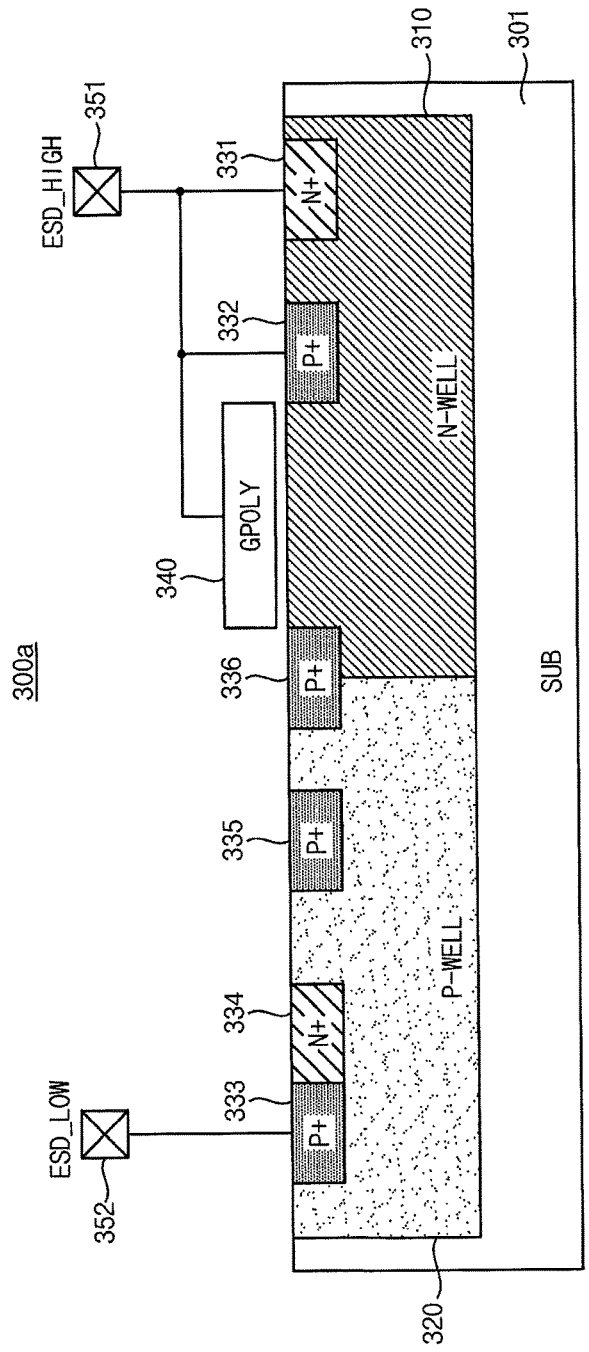
FIG. 12 is a cross-sectional view of an example of the ESD protection device of FIG. 9.

FIG. 12 is a cross-sectional view of an exemplary embodiment of the ESD protection device of FIG. 9.

Referring to FIG. 12, an ESD protection device 300a may include a fifth impurity region 335, a sixth impurity region 336, and a gate GPOLY 340 in addition to elements of the ESD protection device 300 of FIG. 9.

The fifth impurity region P+ 335 may be formed in the second well 320, may be spaced apart from the fourth impurity region 334 in a direction of the first well 310, and may be of p-type. In some exemplary embodiments, an impurity concentration of the fifth impurity region 335 may be higher than the impurity concentration of the second well 320. The fifth impurity region 335 may be electrically floated.

The sixth impurity region P+ 336 may be formed at a boundary region between the first well 310 and the second well 320, may be spaced apart from the second impurity region 332 and the fifth impurity region 335, and may be of p-type. In some exemplary embodiments, an impurity concentration of the sixth impurity region 336 may be higher than the impurity concentration of the second well 320. The sixth impurity region 336 may be electrically floated.

In some exemplary embodiments, the first impurity region 331 and the fourth impurity region 334 may be formed at the same time by a same ion implantation process and, as a result, the impurity concentrations of the first impurity region 331 and the fourth impurity region 334 may be substantially the same.

In some exemplary embodiments, the second impurity region 332, the third impurity region 333, the fifth impurity region 335, and the sixth impurity region 336 may be formed at the same time by a same ion implantation process and as a result, the impurity concentrations of the second impurity region 332, the third impurity region 333, the fifth impurity region 335, and the sixth impurity region 336 may be substantially the same.

The gate 340 may be formed above the semiconductor substrate 301 between the second impurity region 332 and the sixth impurity region 336. In some exemplary embodiments, the gate 340 may include polysilicon. The gate 340 may be electrically connected to the first electrode pad 351.

The fifth impurity region 335, the sixth impurity region 336, and the gate 340 included in the ESD protection device 300a of FIG. 12 may have the same structure as the fifth impurity region 135, the sixth impurity region 136, and the gate 140 included in the ESD protection device 100 of FIG. 1. As a result, effects of the fifth impurity region 335, the sixth impurity region 336, and the gate 340 on the ESD protection device 300a of FIG. 12 may have the same as effects of the fifth impurity region 135, the sixth impurity region 136, and the gate 140 on the ESD protection device 100 of FIG. 1.

That is, as described above with reference to FIGS. 1 to 5, the sixth impurity region 336 and the gate 340 may decrease a breakdown voltage, at which an avalanche breakdown occurs at a junction of the first well 310 and the second well 320. As a result, a triggering voltage of the ESD protection device 300a may decrease.

In addition, the fifth impurity region 335 may decrease a current gain of the PNP BJT 361 and, as a result, a holding voltage of the ESD protection device 300a may increase.

In addition, as a width of the fifth impurity region 335 increases, the current gain of the PNP BJT 361 may decrease such that the holding voltage of the ESD protection device 300a may increase. Similarly, as the width of the fifth impurity region 335 decreases, the current gain of the PNP BJT 361 may increase such that the holding voltage of the ESD protection device 300a may decrease. As a result, the holding voltage of the ESD protection device 300a may be determined based on the width of the fifth impurity region 335.

As described above with reference to FIGS. 9 to 12, the ESD protection device 300a according to exemplary embodiments may have a relatively low triggering voltage and a relatively high holding voltage. In addition, the holding voltage of the ESD protection device 300a may be adjusted by controlling the width of the fifth impurity region 335.

Figure 13:
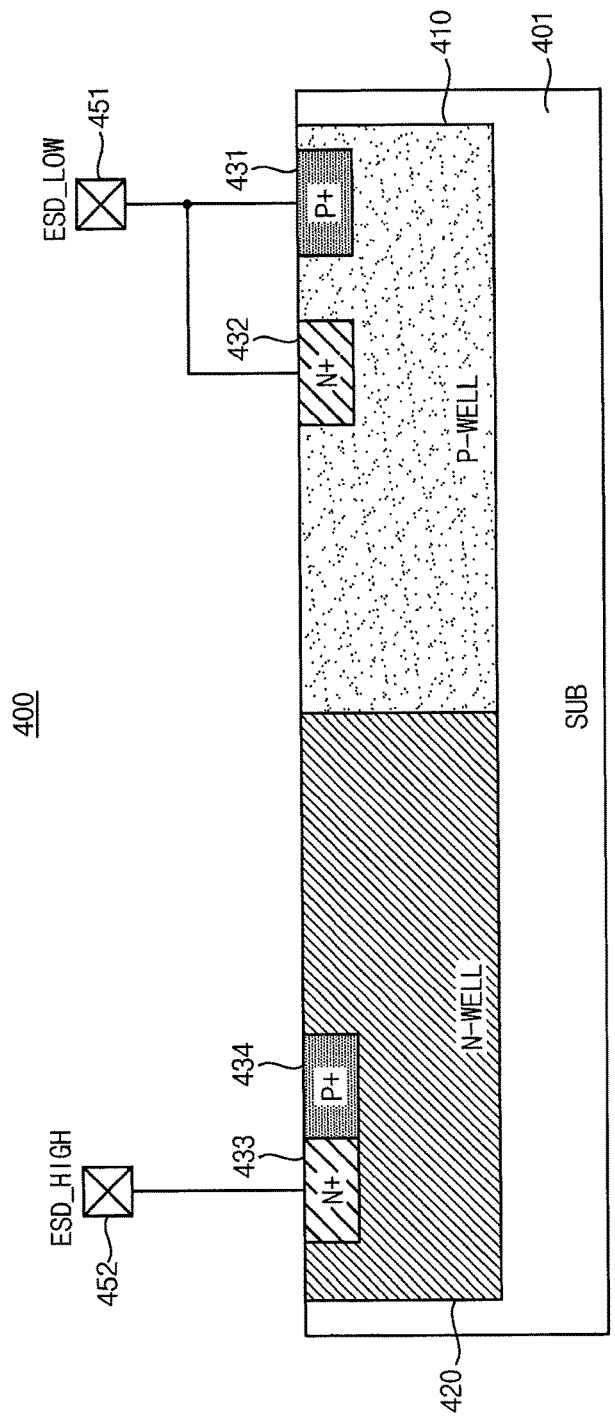
FIG. 13 is a cross-sectional view of an ESD protection device according to exemplary embodiments.

FIG. 13 is a cross-sectional view of an ESD protection device according to exemplary embodiments.

Referring to FIG. 13, an ESD protection device 400 includes a semiconductor substrate SUB 401, a first well 410, a second well 420, a first impurity region 431, a second impurity region 432, a third impurity region 433, and a fourth impurity region 434.

The first well 410 is formed in the semiconductor substrate 401 and has a first conductivity type.

The second well 420 is formed in the semiconductor substrate 401 to contact the first well 410 and has a second conductivity type.

In some exemplary embodiments, the first conductivity type may correspond to p-type, and the second conductivity type may correspond to n-type. In this case, the first well 410 may correspond to a p-well, and the second well 420 may correspond to an n-well.

Hereinafter, in this exemplary embodiment the first conductivity type is assumed to be p-type, and the second conductivity type is assumed to be n-type.

The first impurity region P+ 431 is formed in the first well 410 and is of p-type. In some exemplary embodiments, an impurity concentration of the first impurity region 431 may be higher than an impurity concentration of the first well 410.

The second impurity region N+ 432 is formed in the first well 410, is spaced apart from the first impurity region 431 in a direction of the second well 420, and is of n-type. In some exemplary embodiments, an impurity concentration of the second impurity region 432 may be higher than an impurity concentration of the second well 420.

The third impurity region N+ 433 is formed in the second well 420 and is of n-type. In some exemplary embodiments, an impurity concentration of the third impurity region 433 may be higher than the impurity concentration of the second well 420.

The fourth impurity region P+ 434 is formed in the second well 420, is located in a direction of the first well 410 from the third impurity region 433 and contacts the third impurity region 433, and is of p-type. In some exemplary embodiments, an impurity concentration of the fourth impurity region 434 may be higher than the impurity concentration of the first well 410.

The first impurity region 431 and the second impurity region 432 may be electrically connected to a first electrode pad ESD_LOW 451. The third impurity region 433 may be electrically connected to a second electrode pad ESD_HIGH 452.

The fourth impurity region 434 may be electrically floated.

The first electrode pad 451 may be coupled to a relatively low voltage, and the second electrode pad 452 may be coupled to a relatively high voltage. In some exemplary embodiments, the first electrode pad 451 may be coupled to a ground voltage, and the second electrode pad 452 may be coupled to a supply voltage. In other exemplary embodiments, the first electrode pad 451 may be coupled to the ground voltage, and the second electrode pad 452 may be coupled to a data input/output pin.

As will be described in greater detail later, when an ESD event occurs such that positive charge flows in the ESD protection device 400 through the second electrode pad 452, the ESD protection device 400 may be turned on to discharge the positive charge to the first electrode pad 451.

Figure 14:
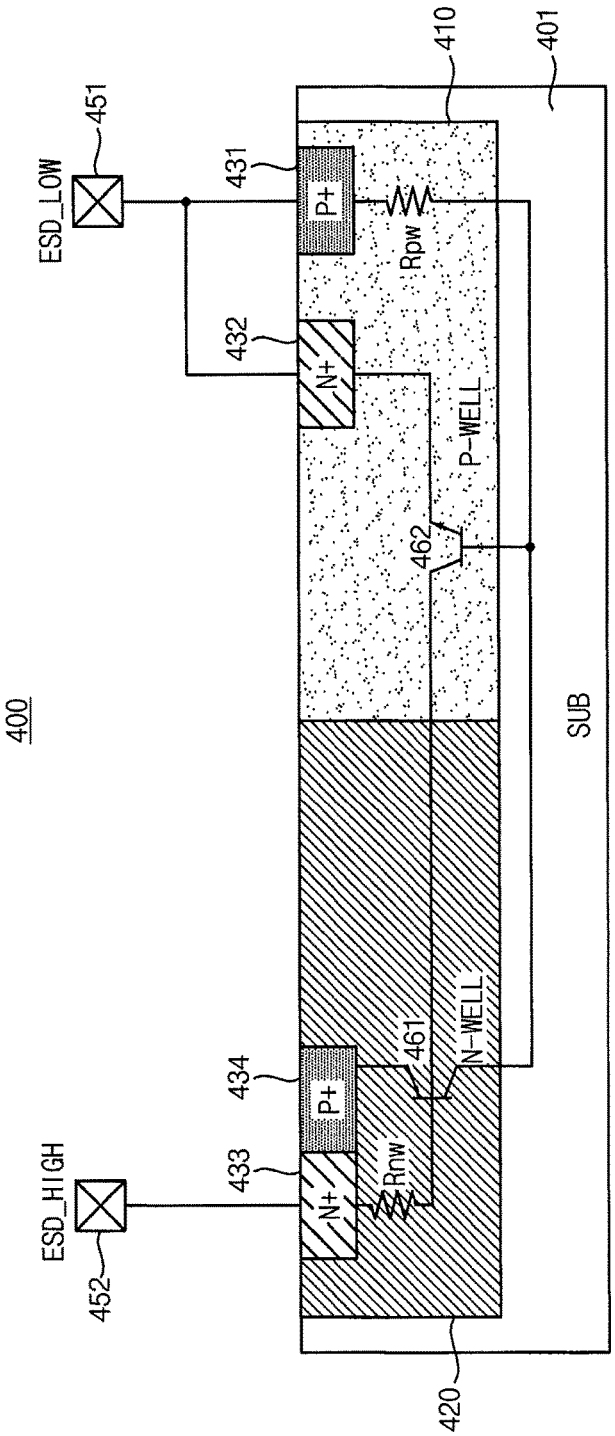
FIG. 14 is a diagram illustrating a BJT parasitically formed in the ESD protection device of FIG. 13.
Figure 15:
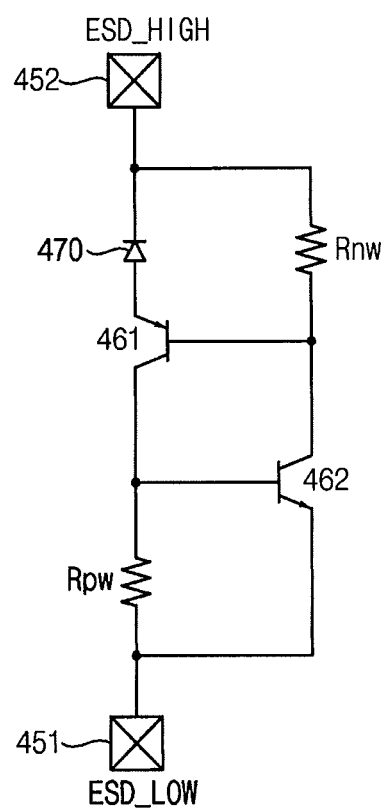
FIG. 15 is a circuit diagram illustrating an equivalent circuit of the ESD protection device of FIG. 13.

FIG. 14 is a diagram illustrating a BJT parasitically formed in the ESD protection device of FIG. 13. FIG. 15 is a circuit diagram illustrating an equivalent circuit of the ESD protection device of FIG. 13.

Referring to FIG. 14, a PNP BJT 461 may be parasitically formed in the ESD protection device 400. An emitter of the PNP BJT 461 may correspond to the fourth impurity region 434, a base of the PNP BJT 461 may correspond to the second well 420, and a collector of the PNP BJT 461 may correspond to the first well 410 and the first impurity region 431.

Additionally, an NPN BJT 462 may be parasitically formed in the ESD protection device 400. A collector of the NPN BJT 462 may correspond to the third impurity region 433 and the second well 420, a base of the NPN BJT 462 may correspond to the first well 410, and an emitter of the NPN BJT 462 may correspond to the second impurity region 432.

In FIG. 14, resistance of the first well 410 is represented as a p-well resistor Rpw, and resistance of the second well 420 is represented as an n-well resistor Rnw. As a result, an equivalent circuit of the ESD protection device 400 of FIG. 13 may be represented as a circuit diagram of FIG. 15.

As illustrated in FIG. 14, the fourth impurity region 434, which corresponds to the emitter of the PNP BJT 461, may not be electrically connected to the second electrode pad 452 directly but may instead be electrically connected to the second electrode pad 452 through the third impurity region 433, which contacts the fourth impurity region 434. The third impurity region 433 of n-type and the fourth impurity region 434 of p-type, which contact each other, may operate as a diode. As a result, as illustrated in FIG. 15, the equivalent circuit of the ESD protection device 400 of FIG. 13 may include a diode 470 coupled between the emitter of the PNP BJT 461 and the second electrode pad 452.

Hereinafter, operation of an ESD protection device in accordance with principles of inventive concepts, such as the ESD protection device 400, will be described with reference to FIGS. 13 to 15.

When an ESD event occurs, positive charge may flow in the ESD protection device 400 through the second electrode pad 452. Because the positive charge is transferred to the second well 420, an electric potential of the second well 420 may increase as the amount of positive charge flowing in the ESD protection device 400 through the second electrode pad 452 increases. As a result, the first well 410 and the second well 420 may be in a reverse biased state. When the electric potential of the second well 420 increases such that an electric potential difference between the first well 410 and the second well 420 reaches a breakdown voltage, an avalanche breakdown may occur at a junction of the first well 410 and the second well 420.

When the avalanche breakdown occurs, electron-hole pairs may be generated and holes of the electron-hole pairs may be transferred to the first well 410 to increase an electric potential of the first well 410. When the electric potential of the first well 410 increases such that an electric potential difference between the first well 410 and the second impurity region 432 becomes greater than a threshold voltage of the NPN BJT 462, the NPN BJT 462 may be turned on.

When the NPN BJT 462 is turned on, a current may flow from the second electrode pad 452 to the first electrode pad 451 through the third impurity region 433, the second well 420, the first well 410, and the second impurity region 432. While the current flows through the second well 420, a voltage drop may occur at the second well 420 across the n-well resistor Rnw. As a result, the electric potential of the second well 420 may become lower than an electrical potential of the fourth impurity region 434, such that the PNP BJT 461 may be turned on.

When the PNP BJT 461 is turned on, a current may flow from the second electrode pad 452 to the first electrode pad 451 through the third impurity region 433, the fourth impurity region 434, the second well 420, the first well 410, and the first impurity region 431. While the current flows through the first well 410, a voltage drop may occur at the first well 410 by the p-well resistor Rpw. As a result, the electric potential of the first well 410 may be maintained higher than an electrical potential of the second impurity region 432, such that the NPN BJT 462 may be turned on more strongly.

As described above, when an ESD event occurs such that positive charge flow in the ESD protection device 400 through the second electrode pad 452, the PNP BJT 461 and the NPN BJT 462 may be maintained in a turned on state through positive feedback. As a result, when the ESD event occurs such that positive charge flow in the ESD protection device 400 through the second electrode pad 452, the ESD protection device 400 may be turned on to discharge the positive charge to the first electrode pad 451.

As described above with reference to FIGS. 14 and 15, because the ESD protection device 400 includes the diode 470 coupled between the emitter of the PNP BJT 461 and the second electrode pad 452, a current gain of the PNP BJT 461 may decrease because of the diode 470 and, as a result, a holding voltage of the ESD protection device 400 may increase.

Figure 16:
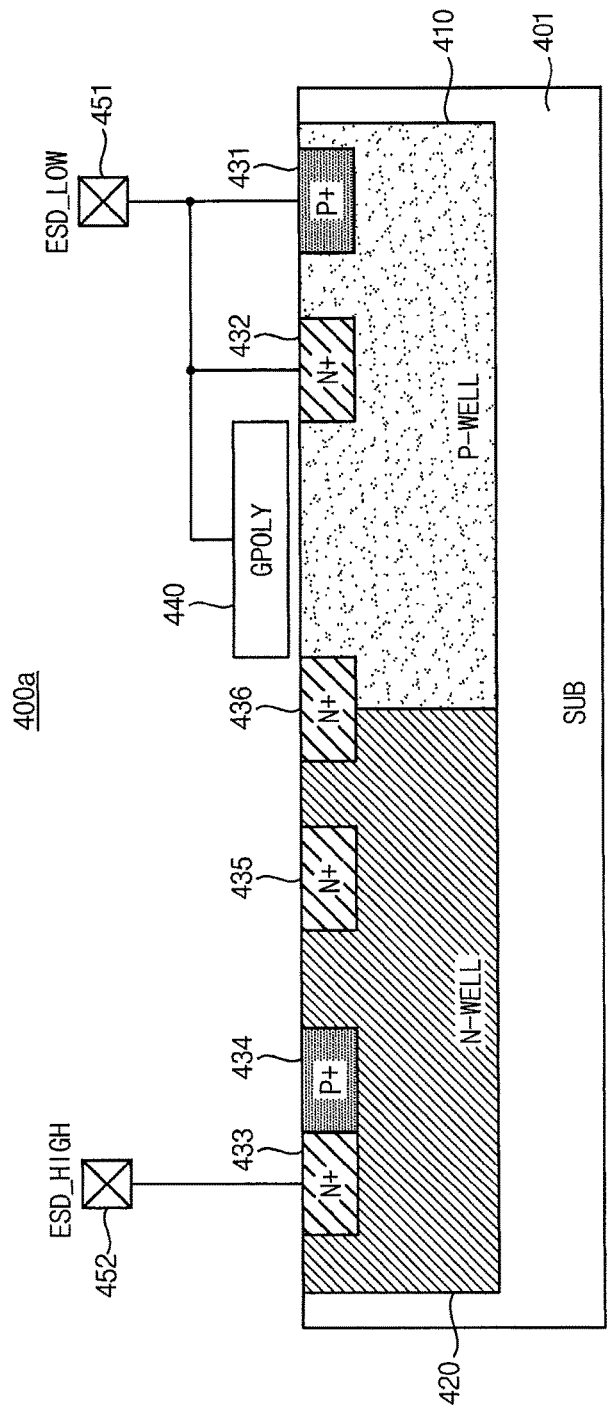
FIG. 16 is a cross-sectional view of an example of the ESD protection device of FIG. 13.

FIG. 16 is a cross-sectional view of an exemplary embodiment of the ESD protection device of FIG. 13.

Referring to FIG. 16, an ESD protection device 400a may further include a fifth impurity region 435, a sixth impurity region 436, and a gate GPOLY 440 from the ESD protection device 400 of FIG. 13.

The fifth impurity region N+ 435 may be formed in the second well 420, may be spaced apart from the fourth impurity region 434 in a direction of the first well 410, and may be of n-type. In some exemplary embodiments, an impurity concentration of the fifth impurity region 435 may be higher than the impurity concentration of the second well 420. The fifth impurity region 435 may be electrically floated.

The sixth impurity region N+ 436 may be formed at a boundary region between the first well 410 and the second well 420, may be spaced apart from the second impurity region 432 and the fifth impurity region 435, and may be of n-type. In some exemplary embodiments, an impurity concentration of the sixth impurity region 436 may be higher than the impurity concentration of the second well 420. The sixth impurity region 436 may be electrically floated.

In some exemplary embodiments, the first impurity region 431 and the fourth impurity region 434 may be formed at the same time by a same ion implantation process and, as a result, the impurity concentrations of the first impurity region 431 and the fourth impurity region 434 may be substantially the same.

In some exemplary embodiments, the second impurity region 432, the third impurity region 433, the fifth impurity region 435, and the sixth impurity region 436 may be formed at the same time by a same ion implantation process and, as a result, the impurity concentrations of the second impurity region 432, the third impurity region 433, the fifth impurity region 435, and the sixth impurity region 436 may be substantially the same.

The gate 440 may be formed above the semiconductor substrate 401 between the second impurity region 432 and the sixth impurity region 436. In some exemplary embodiments, the gate 440 may include polysilicon. The gate 440 may be electrically connected to the first electrode pad 451.

The fifth impurity region 435, the sixth impurity region 436, and the gate 440 included in the ESD protection device 400a of FIG. 16 may have the same structure as the fifth impurity region 235, the sixth impurity region 236, and the gate 240 included in the ESD protection device 200 of FIG. 6. As a result, effects of the fifth impurity region 435, the sixth impurity region 436, and the gate 440 on the ESD protection device 400a of FIG. 16 may have the same as effects as those of the fifth impurity region 235, the sixth impurity region 236, and the gate 240 on the ESD protection device 200 of FIG. 6.

That is, as described above with reference to FIGS. 6 to 8, the sixth impurity region 436 and the gate 440 may decrease a breakdown voltage, at which an avalanche breakdown occurs at a junction of the first well 410 and the second well 420 and, consequently, a triggering voltage of the ESD protection device 400a may decrease.

In addition, the fifth impurity region 435 may decrease a current gain of the NPN BJT 462 and, consequently, a holding voltage of the ESD protection device 400a may increase.

In addition, as a width of the fifth impurity region 435 increases, the current gain of the NPN BJT 462 may decrease such that the holding voltage of the ESD protection device 400a may increase. Similarly, as the width of the fifth impurity region 435 decreases, the current gain of the NPN BJT 462 may increase such that the holding voltage of the ESD protection device 400a may decrease. As a result, the holding voltage of the ESD protection device 400a may be determined based on the width of the fifth impurity region 435.

As described above with reference to FIGS. 13 to 16, the ESD protection device 400a according to exemplary embodiments may have a relatively low triggering voltage and a relatively high holding voltage. In addition, the holding voltage of the ESD protection device 400a may be adjusted by controlling the width of the fifth impurity region 435.

Figure 17:
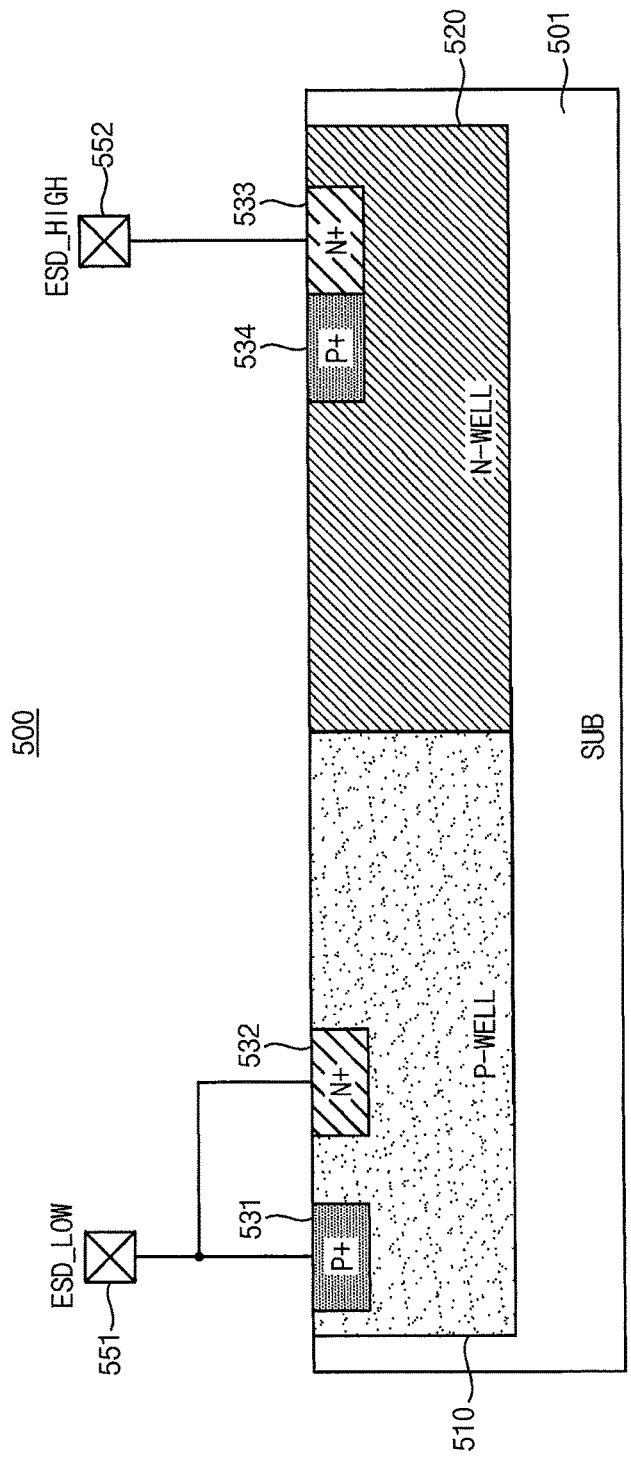
FIG. 17 is a cross-sectional view of an ESD protection device according to exemplary embodiments.

FIG. 17 is a cross-sectional view of an ESD protection device according to exemplary embodiments.

Referring to FIG. 17, an ESD protection device 500 includes a semiconductor substrate SUB 501, a first well 510, a second well 520, a first impurity region 531, a second impurity region 532, a third impurity region 533, and a fourth impurity region 534.

The first well 510 is formed in the semiconductor substrate 501 and has a first conductivity type.

The second well 520 is formed in the semiconductor substrate 501 to contact the first well 510 and has a second conductivity type.

In some exemplary embodiments, the first conductivity type may correspond to p-type, and the second conductivity type may correspond to n-type. In such exemplary embodiments, the first well 510 may correspond to a p-well, and the second well 520 may correspond to an n-well.

Hereinafter, in this exemplary embodiment, the first conductivity type is assumed to be p-type, and the second conductivity type is assumed to be n-type.

The first impurity region P+ 531 is formed in the first well 510 and is of p-type. In some exemplary embodiments, an impurity concentration of the first impurity region 531 may be higher than an impurity concentration of the first well 510.

The second impurity region N+ 532 is formed in the first well 510, is spaced apart from the first impurity region 531 in a direction of the second well 520, and is of n-type. In some exemplary embodiments, an impurity concentration of the second impurity region 532 may be higher than an impurity concentration of the second well 520.

The third impurity region N+ 533 is formed in the second well 520 and is of n-type. In some exemplary embodiments, an impurity concentration of the third impurity region 533 may be higher than the impurity concentration of the second well 520.

The fourth impurity region P+ 534 is formed in the second well 520, is located in a direction of the first well 510 from the third impurity region 533 and contacts the third impurity region 533, and is of p-type. In some exemplary embodiments, an impurity concentration of the fourth impurity region 534 may be higher than the impurity concentration of the first well 510.

The first impurity region 531 and the second impurity region 532 may be electrically connected to a first electrode pad ESD_LOW 551. The third impurity region 533 may be electrically connected to a second electrode pad ESD_HIGH 552.

The fourth impurity region 534 may be electrically floated.

The first electrode pad 551 may be coupled to a relatively low voltage, and the second electrode pad 552 may be coupled to a relatively high voltage. In some exemplary embodiments, the first electrode pad 551 may be coupled to a ground voltage, and the second electrode pad 552 may be coupled to a supply voltage. In other exemplary embodiments, the first electrode pad 551 may be coupled to the ground voltage, and the second electrode pad 552 may be coupled to a data input/output pin.

As will be described in greater detail later, when an ESD event occurs such that positive charge flows in the ESD protection device 500 through the second electrode pad 552, the ESD protection device 500 may be turned on to discharge the positive charges to the first electrode pad 551.

Figure 18:
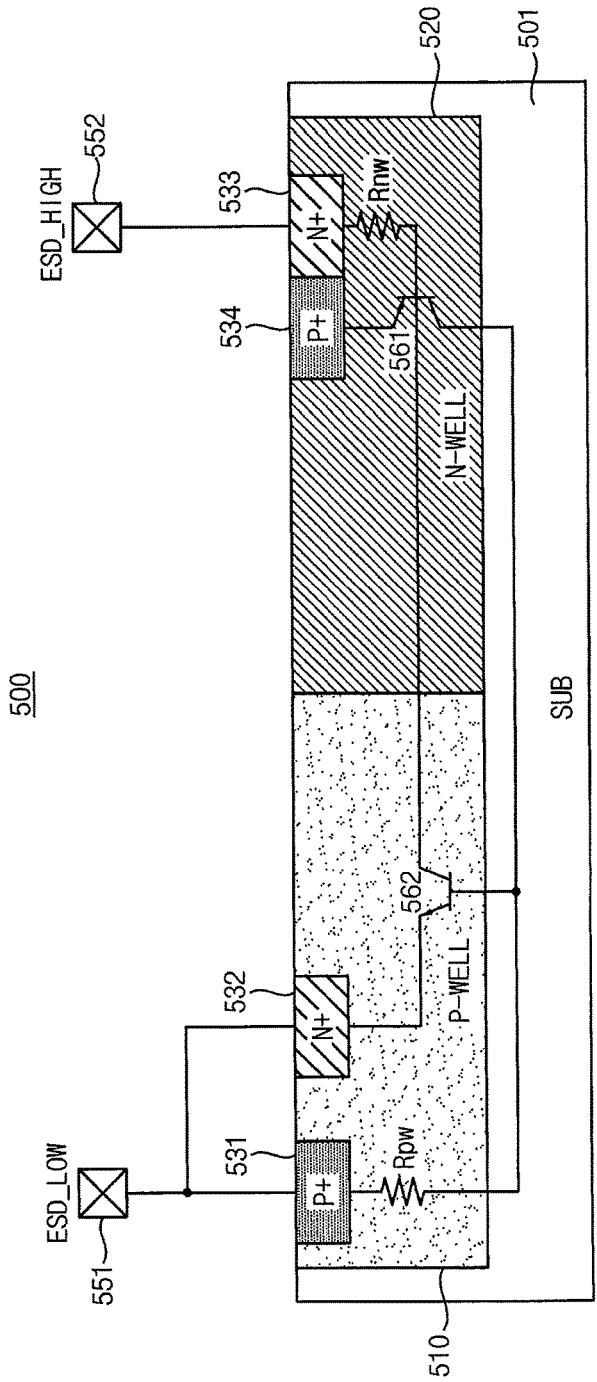
FIG. 18 is a diagram illustrating a BJT parasitically formed in the ESD protection device of FIG. 17.
Figure 19:
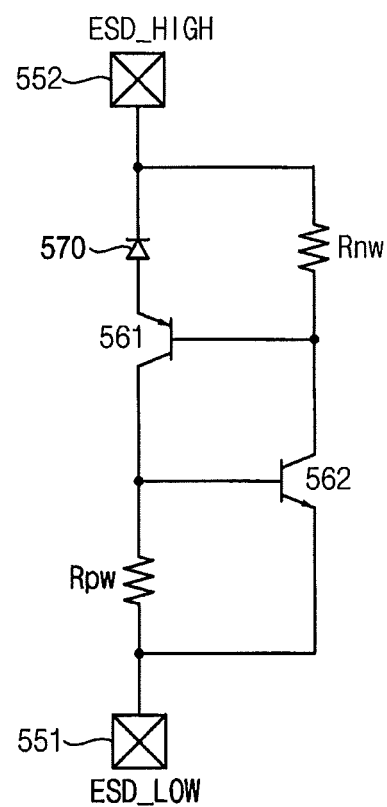
FIG. 19 is a circuit diagram illustrating an equivalent circuit of the ESD protection device of FIG. 17.

FIG. 18 is a diagram illustrating a BJT parasitically formed in the ESD protection device of FIG. 17. FIG. 19 is a circuit diagram illustrating an equivalent circuit of the ESD protection device of FIG. 17.

Referring to FIG. 18, a PNP BJT 561 may be parasitically formed in the ESD protection device 500. An emitter of the PNP BJT 561 may correspond to the fourth impurity region 534, a base of the PNP BJT 561 may correspond to the second well 520, and a collector of the PNP BJT 561 may correspond to the first well 510 and the first impurity region 531.

In addition, an NPN BJT 562 may be parasitically formed in the ESD protection device 500. A collector of the NPN BJT 562 may correspond to the third impurity region 533 and the second well 520, a base of the NPN BJT 562 may correspond to the first well 510, and an emitter of the NPN BJT 562 may correspond to the second impurity region 532.

In FIG. 18, resistance of the first well 510 is represented as a p-well resistor Rpw, and resistance of the second well 520 is represented as an n-well resistor Rnw. An equivalent circuit of the ESD protection device 500 of FIG. 17 may be represented as a circuit diagram of FIG. 19.

As illustrated in FIG. 18, the fourth impurity region 534, which corresponds to the emitter of the PNP BJT 561, may not be electrically connected to the second electrode pad 552 directly, but may instead be electrically connected to the second electrode pad 552 through the third impurity region 533, which contacts the fourth impurity region 534. The third impurity region 533 of n-type and the fourth impurity region 534 of p-type, which contact each other, may operate as a diode. As a result, as illustrated in FIG. 19, the equivalent circuit of the ESD protection device 500 of FIG. 17 may include a diode 570 coupled between the emitter of the PNP BJT 561 and the second electrode pad 552.

Hereinafter, operation of an ESD protection device in accordance with principles of inventive concepts, such as ESD protection device 500 will be described with reference to FIGS. 17 to 19.

When an ESD event occurs, positive charge may flow in the ESD protection device 500 through the second electrode pad 552. Because the positive charge is transferred to the second well 520, an electric potential of the second well 520 may increase as an amount of the positive charges flowing in the ESD protection device 500 through the second electrode pad 552 increases. As a result, the first well 510 and the second well 520 may be in a reverse biased state. When the electric potential of the second well 520 increases such that an electric potential difference between the first well 510 and the second well 520 reaches a breakdown voltage, an avalanche breakdown may occur at a junction of the first well 510 and the second well 520.

When the avalanche breakdown occurs, electron-hole pairs may be generated and holes of the electron-hole pairs may be transferred to the first well 510 to increase an electric potential of the first well 510. When the electric potential of the first well 510 increases such that an electric potential difference between the first well 510 and the second impurity region 532 becomes greater than a threshold voltage of the NPN BJT 562, the NPN BJT 562 may be turned on.

When the NPN BJT 562 is turned on, current may flow from the second electrode pad 552 to the first electrode pad 551 through the third impurity region 533, the second well 520, the first well 510, and the second impurity region 532. While the current flows through the second well 520, a voltage drop may occur at the second well 520 across the n-well resistor Rnw. As a result, the electric potential of the second well 520 may become lower than an electrical potential of the fourth impurity region 534, such that the PNP BJT 561 may be turned on.

When the PNP BJT 561 is turned on, a current may flow from the second electrode pad 552 to the first electrode pad 551 through the third impurity region 533, the fourth impurity region 534, the second well 520, the first well 510, and the first impurity region 531. While the current flows through the first well 510, a voltage drop may occur at the first well 510 across the p-well resistor Rpw. As a result, the electric potential of the first well 510 may be maintained higher than an electrical potential of the second impurity region 532, such that the NPN BJT 562 may be turned on more strongly.

As described above, when an ESD event occurs such that positive charge flow in the ESD protection device 500 through the second electrode pad 552, the PNP BJT 561 and the NPN BJT 562 may be maintained in a turned on state through positive feedback. As a result, when the ESD event occurs such that positive charge flow in the ESD protection device 500 through the second electrode pad 552, the ESD protection device 500 may be turned on to discharge the positive charges to the first electrode pad 551.

As described above with reference to FIGS. 18 and 19, because the ESD protection device 500 includes the diode 570 coupled between the emitter of the PNP BJT 561 and the second electrode pad 552, a current gain of the PNP BJT 561 may decrease because of the diode 570 and, as a result, a holding voltage of the ESD protection device 500 may increase.

Figure 20:
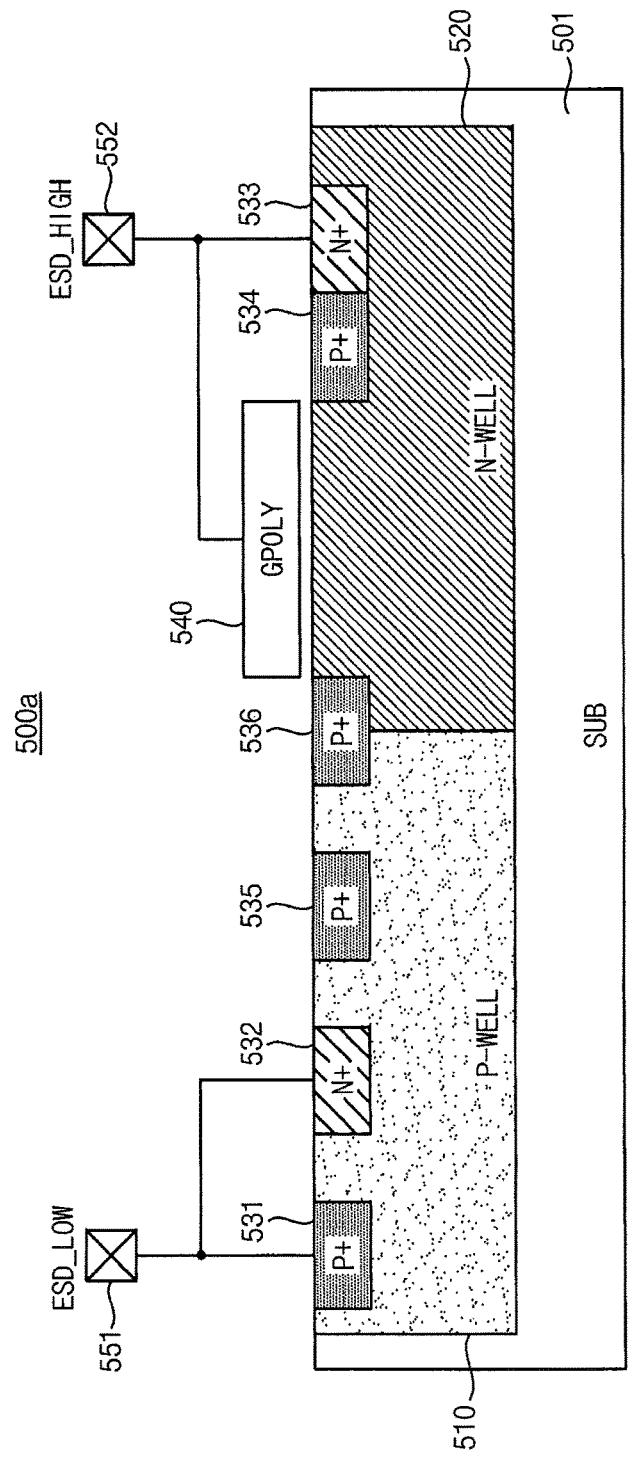
FIG. 20 is a cross-sectional view of an example of the ESD protection device of FIG. 17.

FIG. 20 is a cross-sectional view of an exemplary embodiment of an ESD protection device in accordance with principles of inventive concepts, such as that of FIG. 17.

Referring to FIG. 20, an ESD protection device such as device 500a may further include a fifth impurity region 535, a sixth impurity region 536, and a gate GPOLY 540 from the ESD protection device 500 of FIG. 17.

The fifth impurity region P+ 535 may be formed in the first well 510, may be spaced apart from the second impurity region 532 in a direction of the second well 520, and may be of p-type. In some exemplary embodiments, an impurity concentration of the fifth impurity region 535 may be higher than the impurity concentration of the first well 510. The fifth impurity region 535 may be electrically floated.

The sixth impurity region P+ 536 may be formed at a boundary region between the first well 510 and the second well 520, may be spaced apart from the fourth impurity region 534 and the fifth impurity region 535, and may be of p-type. In some exemplary embodiments, an impurity concentration of the sixth impurity region 536 may be higher than the impurity concentration of the first well 510. The sixth impurity region 536 may be electrically floated.

In some exemplary embodiments, the second impurity region 532 and the third impurity region 533 may be formed at the same time by a same ion implantation process and, as a result, the impurity concentrations of the second impurity region 532 and the third impurity region 533 may be substantially the same.

In some exemplary embodiments, the first impurity region 531, the fourth impurity region 534, the fifth impurity region 535, and the sixth impurity region 536 may be formed at the same time by a same ion implantation process and, as a result, the impurity concentrations of the first impurity region 531, the fourth impurity region 534, the fifth impurity region 535, and the sixth impurity region 536 may be substantially the same.

The gate 540 may be formed above the semiconductor substrate 501 between the fourth impurity region 534 and the sixth impurity region 536. In some exemplary embodiments, the gate 540 may include polysilicon. The gate 540 may be electrically connected to the second electrode pad 552.

The fifth impurity region 535, the sixth impurity region 536, and the gate 540 included in the ESD protection device 500a of FIG. 20 may have the same structure as the fifth impurity region 135, the sixth impurity region 136, and the gate 140 included in the ESD protection device 100 of FIG. 1. As a result, effects of the fifth impurity region 535, the sixth impurity region 536, and the gate 540 on the ESD protection device 500a of FIG. 20 may have the same as effects as those of the fifth impurity region 135, the sixth impurity region 136, and the gate 140 on the ESD protection device 100 of FIG. 1.

That is, as described above with reference to FIGS. 1 to 5, the sixth impurity region 536 and the gate 540 may decrease a breakdown voltage, at which an avalanche breakdown occurs at a junction of the first well 510 and the second well 520. As a result, a triggering voltage of the ESD protection device 500a may decrease.

In addition, the fifth impurity region 535 may decrease a current gain of the PNP BJT 561. As a result, a holding voltage of the ESD protection device 500a may increase.

In addition, as a width of the fifth impurity region 535 increases, the current gain of the PNP BJT 561 may decrease such that the holding voltage of the ESD protection device 500a may increase. Similarly, as the width of the fifth impurity region 535 decreases, the current gain of the PNP BJT 561 may increase such that the holding voltage of the ESD protection device 500a may decrease. As a result, the holding voltage of the ESD protection device 500a may be determined based on the width of the fifth impurity region 535.

As described above with reference to FIGS. 17 to 20, the ESD protection device 500a according to exemplary embodiments may have a relatively low triggering voltage and a relatively high holding voltage. In addition, the holding voltage of the ESD protection device 500a may be adjusted by controlling the width of the fifth impurity region 535.

Figure 21:
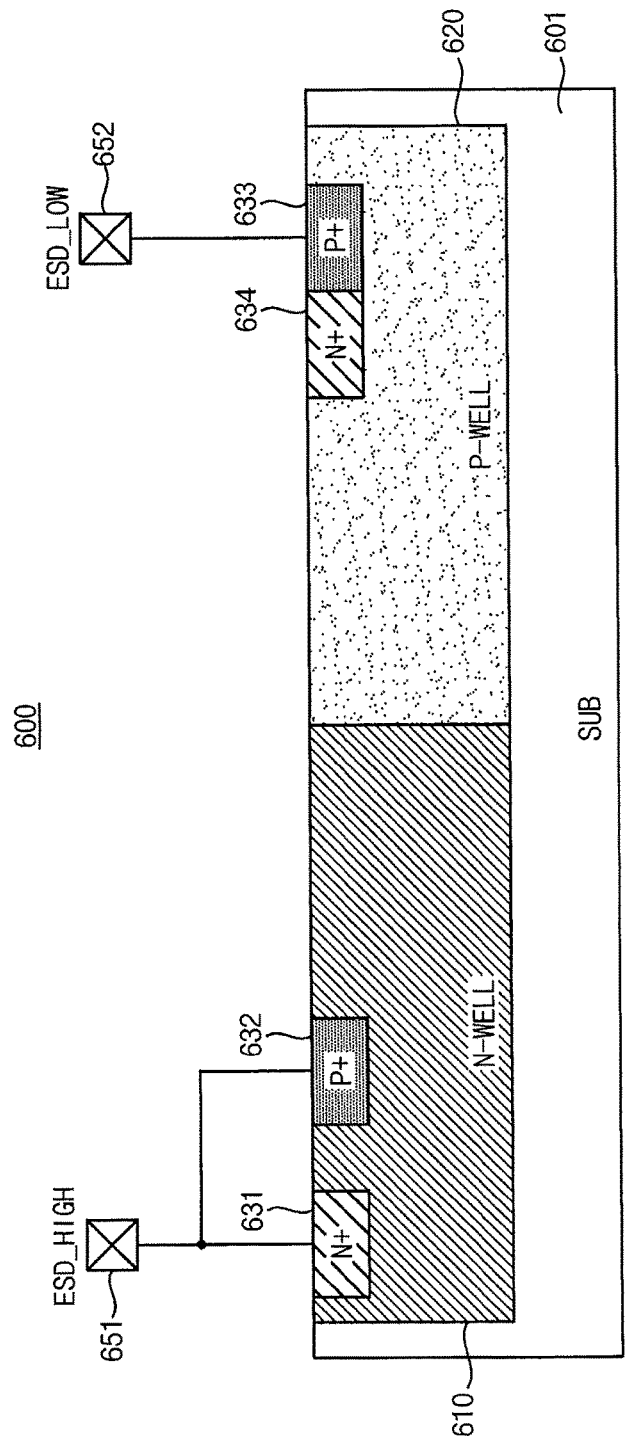
FIG. 21 is a cross-sectional view of an ESD protection device according to exemplary embodiments.

FIG. 21 is a cross-sectional view an exemplary embodiment of an ESD protection device in accordance with principles of inventive concepts.

Referring to FIG. 21, an ESD protection device 600 includes a semiconductor substrate SUB 601, a first well 610, a second well 620, a first impurity region 631, a second impurity region 632, a third impurity region 633, and a fourth impurity region 634.

The first well 610 is formed in the semiconductor substrate 601 and has a first conductivity type.

The second well 620 is formed in the semiconductor substrate 601 to contact the first well 610 and has a second conductivity type.

In some exemplary embodiments, the first conductivity type may correspond to n-type, and the second conductivity type may correspond to p-type. In such embodiments, the first well 610 may correspond to an n-well, and the second well 620 may correspond to a p-well.

Hereinafter, in this exemplary embodiment the first conductivity type is assumed to be n-type, and the second conductivity type is assumed to be p-type.

The first impurity region N+ 631 is formed in the first well 610 and is of n-type. In some exemplary embodiments, an impurity concentration of the first impurity region 631 may be higher than an impurity concentration of the first well 610.

The second impurity region P+ 632 is formed in the first well 610, is spaced apart from the first impurity region 631 in a direction of the second well 620, and is of p-type. In some exemplary embodiments, an impurity concentration of the second impurity region 632 may be higher than an impurity concentration of the second well 620.

The third impurity region P+ 633 is formed in the second well 620 and is of p-type. In some exemplary embodiments, an impurity concentration of the third impurity region 633 may be higher than the impurity concentration of the second well 620.

The fourth impurity region N+ 634 is formed in the second well 620, is located in a direction of the first well 610 from the third impurity region 633 and contacts the third impurity region 633, and is of n-type. In some exemplary embodiments, an impurity concentration of the fourth impurity region 634 may be higher than the impurity concentration of the first well 610.

The first impurity region 631 and the second impurity region 632 may be electrically connected to a first electrode pad ESD_HIGH 651. The third impurity region 633 may be electrically connected to a second electrode pad ESD_LOW 652.

The fourth impurity region 634 may be electrically floated.

The first electrode pad 651 may be coupled to a relatively high voltage, and the second electrode pad 652 may be coupled to a relatively low voltage. In some exemplary embodiments, the first electrode pad 651 may be coupled to a supply voltage, and the second electrode pad 652 may be coupled to a ground voltage. In other exemplary embodiments, the first electrode pad 651 may be coupled to a data input/output pin, and the second electrode pad 652 may be coupled to the ground voltage.

As will be described in greater detail later, when an ESD event occurs such that positive charge flows in the ESD protection device 600 through the first electrode pad 651, the ESD protection device 600 may be turned on to discharge the positive charges to the second electrode pad 652.

Figure 22:
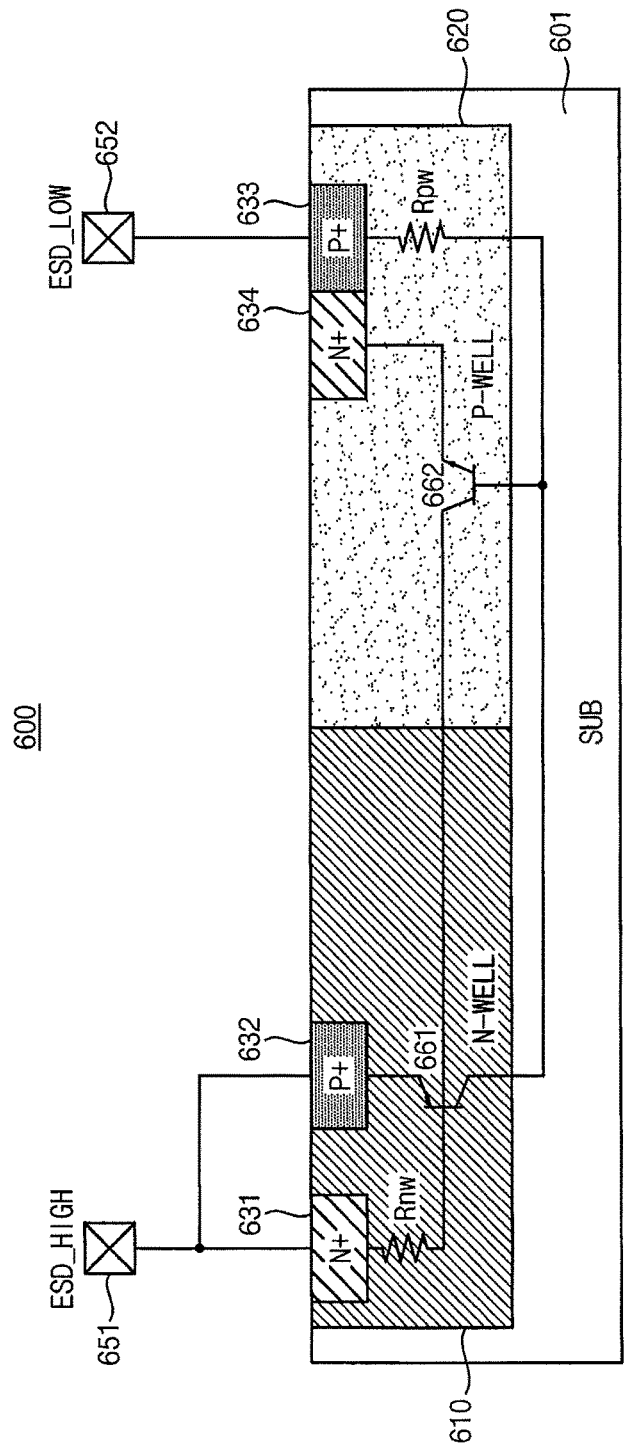
FIG. 22 is a diagram illustrating a BJT parasitically formed in the ESD protection device of FIG. 21.
Figure 23:
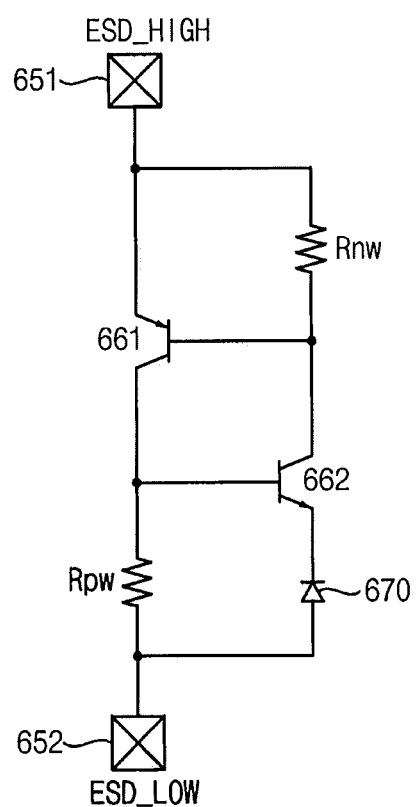
FIG. 23 is a circuit diagram illustrating an equivalent circuit of the ESD protection device of FIG. 21.

FIG. 22 is a diagram illustrating a BJT parasitically fainted in the ESD protection device of FIG. 21. FIG. 23 is a circuit diagram illustrating an equivalent circuit of the ESD protection device of FIG. 21.

Referring to FIG. 22, a PNP BJT 661 may be parasitically formed in the ESD protection device 600. An emitter of the PNP BJT 661 may correspond to the second impurity region 632, a base of the PNP BJT 661 may correspond to the first well 610, and a collector of the PNP BJT 661 may correspond to the second well 620 and the third impurity region 633.

In addition, an NPN BJT 662 may be parasitically formed in the ESD protection device 600. A collector of the NPN BJT 662 may correspond to the first impurity region 631 and the first well 610, a base of the NPN BJT 662 may correspond to the second well 620, and an emitter of the NPN BJT 662 may correspond to the fourth impurity region 634.

In FIG. 22, resistance of the first well 610 is represented as an n-well resistor Rnw, and resistance of the second well 620 is represented as a p-well resistor Rpw.

As a result, an equivalent circuit of the ESD protection device 600 of FIG. 21 may be represented as a circuit diagram of FIG. 23.

As illustrated in FIG. 22, the fourth impurity region 634, which corresponds to the emitter of the NPN BJT 662, may not be electrically connected to the second electrode pad 652 directly but, rather, may be electrically connected to the second electrode pad 652 through the third impurity region 633, which contacts the fourth impurity region 634. The third impurity region 633 of p-type and the fourth impurity region 634 of n-type, which contact each other, may operate as a diode. As a result, as illustrated in FIG. 23, the equivalent circuit of the ESD protection device 600 of FIG. 21 may include a diode 670 coupled between the emitter of the NPN BJT 662 and the second electrode pad 652.

Hereinafter, operation of the ESD protection device 600 will be described with reference to FIGS. 21 to 23.

When an ESD event occurs, positive charge may flow in the ESD protection device 600 through the first electrode pad 651. Because positive charge is transferred to the first well 610, an electric potential of the first well 610 may increase as an amount of positive charge flowing in the ESD protection device 600 through the first electrode pad 651 increases. As a result, the first well 610 and the second well 620 may be in a reverse biased state. When the electric potential of the first well 610 increases such that an electric potential difference between the first well 610 and the second well 620 reaches a breakdown voltage, an avalanche breakdown may occur at a junction of the first well 610 and the second well 620.

When the avalanche breakdown occurs, electron-hole pairs may be generated and holes of the electron-hole pairs may be transferred to the second well 620 to increase an electric potential of the second well 620. When the electric potential of the second well 620 increases such that an electric potential difference between the second well 620 and the fourth impurity region 634 becomes greater than a threshold voltage of the NPN BJT 662, the NPN BJT 662 may be turned on.

When the NPN BJT 662 is turned on, a current may flow from the first electrode pad 651 to the second electrode pad 652 through the first impurity region 631, the first well 610, the second well 620, the fourth impurity region 634, and the third impurity region 633. While the current flows through the first well 610, a voltage drop may occur at the first well 610 across the n-well resistor Rnw. As a result, the electric potential of the first well 610 may become lower than an electrical potential of the second impurity region 632, such that the PNP BJT 661 may be turned on.

When the PNP BJT 661 is turned on, a current may flow from the first electrode pad 651 to the second electrode pad 652 through the second impurity region 632, the first well 610, the second well 620, and the third impurity region 633. While the current flows through the second well 620, a voltage drop may occur at the second well 620 across the p-well resistor Rpw. As a result, the electric potential of the second well 620 may be maintained higher than an electrical potential of the fourth impurity region 634, such that the NPN BJT 662 may be turned on more strongly.

As described above, when an ESD event occurs such that positive charge flows in the ESD protection device 600 through the first electrode pad 651, the PNP BJT 661 and the NPN BJT 662 may be maintained in a turned on state through a positive feedback. As a result, when the ESD event occurs such that positive charge flow in the ESD protection device 600 through the first electrode pad 651, the ESD protection device 600 may be turned on to discharge the positive charges to the second electrode pad 652.

As described above with reference to FIGS. 22 and 23, because the ESD protection device 600 includes the diode 670 coupled between the emitter of the NPN BJT 662 and the second electrode pad 652, a current gain of the NPN BJT 662 may decrease because of the diode 670 and, as a result, a holding voltage of the ESD protection device 600 may increase.

Figure 24:
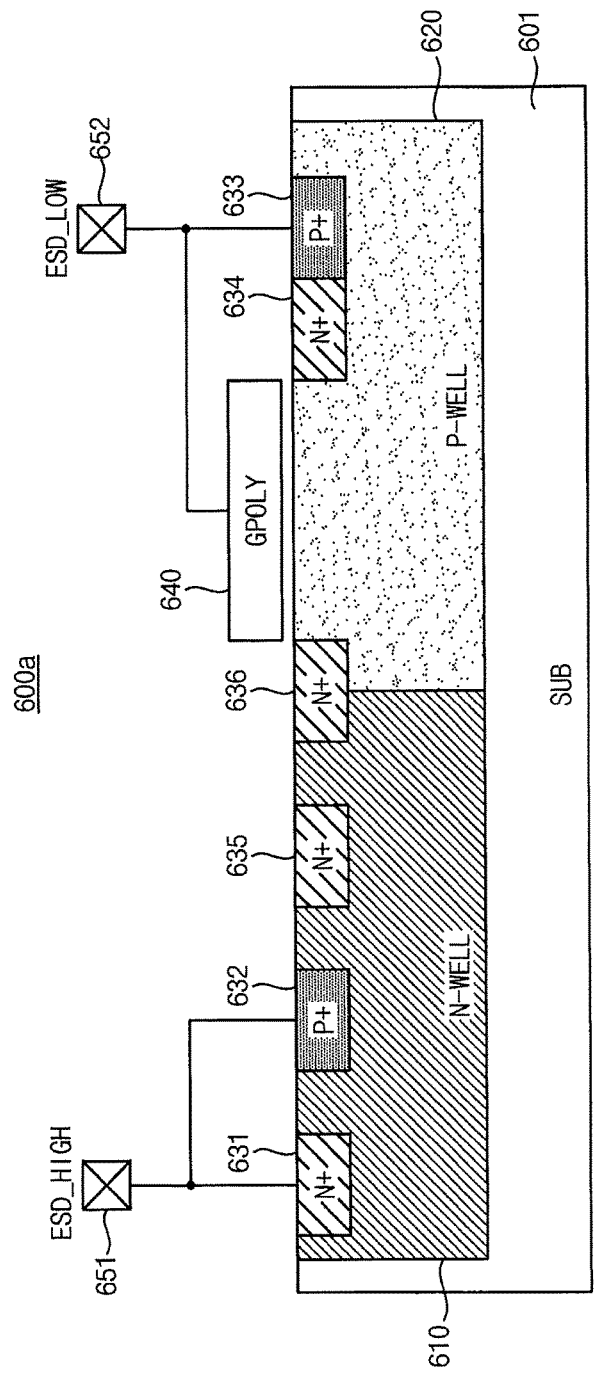
FIG. 24 is a cross-sectional view of an example of the ESD protection device of FIG. 21.

FIG. 24 is a cross-sectional view of an exemplary of the ESD protection device of FIG. 21.

Referring to FIG. 24, an ESD protection device 600a may further include a fifth impurity region 635, a sixth impurity region 636, and a gate GPOLY 640 from the ESD protection device 600 of FIG. 21.

The fifth impurity region N+ 635 may be formed in the first well 610, may be spaced apart from the second impurity region 632 in a direction of the second well 620, and may be of n-type. In some exemplary embodiments, an impurity concentration of the fifth impurity region 635 may be higher than the impurity concentration of the first well 610. The fifth impurity region 635 may be electrically floated.

The sixth impurity region N+ 636 may be formed at a boundary region between the first well 610 and the second well 620, may be spaced apart from the fourth impurity region 634 and the fifth impurity region 635, and may be of n-type. In some exemplary embodiments, an impurity concentration of the sixth impurity region 636 may be higher than the impurity concentration of the first well 610. The sixth impurity region 636 may be electrically floated.

In some exemplary embodiments, the second impurity region 632 and the third impurity region 633 may be formed at the same time by a same ion implantation process and, as a result, the impurity concentrations of the second impurity region 632 and the third impurity region 633 may be substantially the same.

In some exemplary embodiments, the first impurity region 631, the fourth impurity region 634, the fifth impurity region 635, and the sixth impurity region 636 may be formed at the same time by a same ion implantation process and, as a result, the impurity concentrations of the first impurity region 631, the fourth impurity region 634, the fifth impurity region 635, and the sixth impurity region 636 may be substantially the same.

The gate 640 may be formed above the semiconductor substrate 601 between the fourth impurity region 634 and the sixth impurity region 636. In some exemplary embodiments, the gate 640 may include polysilicon. The gate 640 may be electrically connected to the second electrode pad 652.

The fifth impurity region 635, the sixth impurity region 636, and the gate 640 included in the ESD protection device 600a of FIG. 24 may have the same structure as the fifth impurity region 235, the sixth impurity region 236, and the gate 240 included in the ESD protection device 200 of FIG. 6. As a result, effects of the fifth impurity region 635, the sixth impurity region 636, and the gate 640 on the ESD protection device 600a of FIG. 24 may be the same as effects of the fifth impurity region 235, the sixth impurity region 236, and the gate 240 on the ESD protection device 200 of FIG. 6.

That is, as described above with reference to FIGS. 6 to 8, the sixth impurity region 636 and the gate 640 may decrease a breakdown voltage, at which an avalanche breakdown occurs at a junction of the first well 610 and the second well 620 and, as a result, a triggering voltage of the ESD protection device 600a may decrease.

In addition, the fifth impurity region 635 may decrease a current gain of the NPN BJT 662 and, as a result, a holding voltage of the ESD protection device 600a may increase.

In addition, as a width of the fifth impurity region 635 increases, the current gain of the NPN BJT 662 may decrease such that the holding voltage of the ESD protection device 600a may increase. Similarly, as the width of the fifth impurity region 635 decreases, the current gain of the NPN BJT 662 may increase such that the holding voltage of the ESD protection device 600*a* may decrease. As a result, the holding voltage of the ESD protection device 600*a* may be determined based on the width of the fifth impurity region 635.

As described above with reference to FIGS. 21 to 24, the ESD protection device 600*a* according to exemplary embodiments may have a relatively low triggering voltage and a relatively high holding voltage. In addition, the holding voltage of the ESD protection device 600*a* may be adjusted by controlling the width of the fifth impurity region 635.

Figure 25:
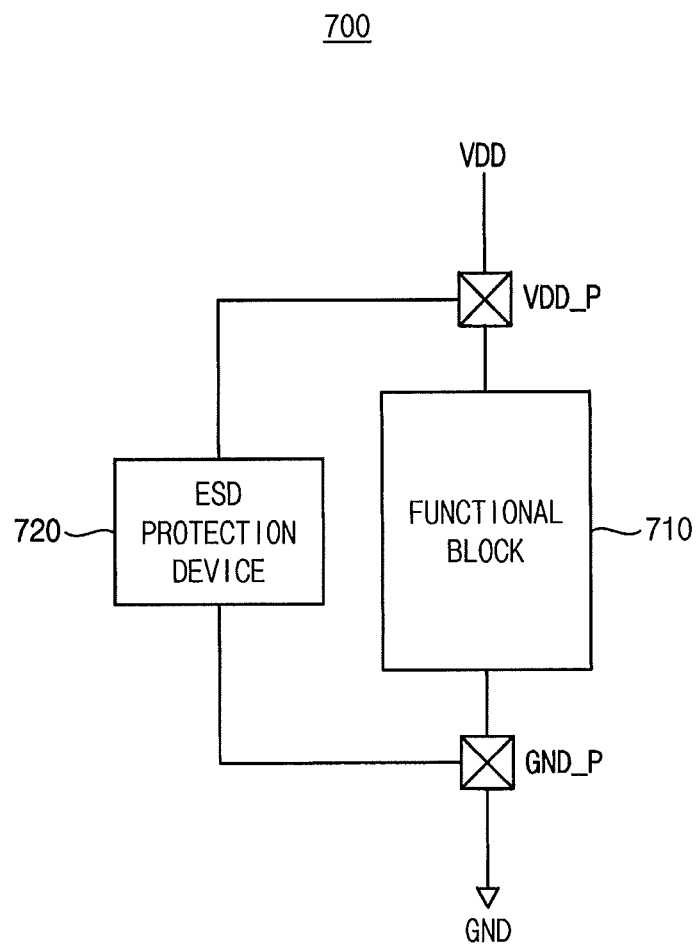
FIG. 25 is a block diagram illustrating an electronic device according to exemplary embodiments.

FIG. 25 is a block diagram illustrating an electronic device according to exemplary embodiments.

Referring to FIG. 25, an electronic device 700 includes a functional block 710 and an ESD protection device 720.

The functional block 710 is coupled between a supply voltage pad VDD_P, which is coupled to a supply voltage VDD, and a ground voltage pad GND_P, which is coupled to a ground voltage GND. The functional block 710 operates using the supply voltage VDD. In some exemplary embodiments, the functional block 710 may include at least one of an application processor, a data input/output circuit, a logic circuit, and a memory device.

The ESD protection device 720 is coupled between the supply voltage pad VDD_P and the ground voltage pad GND_P. When an ESD event occurs such that positive charge flow in the ESD protection device 720 through the supply voltage pad VDD_P, the ESD protection device 720 may be turned on to discharge the positive charges to the ground voltage pad GND_P.

The ESD protection device 720 may be implemented with an ESD protection device in accordance with principles of inventive concepts, such as one of the exemplary ESD protection devices, 100 of FIG. 1, the ESD protection device 200 of FIG. 6, the ESD protection device 300 of FIG. 9, the ESD protection device 400 of FIG. 13, the ESD protection device 500 of FIG. 17, and the ESD protection device 600 of FIG. 21.

When the ESD protection device 720 is implemented with an ESD protection device in accordance with principles of inventive concepts, such as one of the ESD protection device 100 of FIG. 1, the ESD protection device 300 of FIG. 9, and the ESD protection device 600 of FIG. 21, the first electrode pad 151, 351, and 651 of the ESD protection device 100, the ESD protection device 300, and the ESD protection device 600 may correspond to the supply voltage pad VDD_P and the second electrode pad 152, 352, and 652 of the ESD protection device 100, the ESD protection device 300, and the ESD protection device 600 may correspond to the ground voltage pad GND_P.

When the ESD protection device 720 is implemented with an ESD protection device in accordance with principles of inventive concepts, such as one of the ESD protection device 200 of FIG. 6, the ESD protection device 400 of FIG. 13, and the ESD protection device 500 of FIG. 17, the first electrode pad 251, 451, and 551 of the ESD protection device 200, the ESD protection device 400, and the ESD protection device 500 may correspond to the ground voltage pad GND_P and the second electrode pad 252, 452, and 552 of the ESD protection device 200, the ESD protection device 400, and the ESD protection device 500 may correspond to the supply voltage pad VDD_P.

Structures and operations of the ESD protection device 100 of FIG. 1, the ESD protection device 200 of FIG. 6, the ESD protection device 300 of FIG. 9, the ESD protection device 400 of FIG. 13, the ESD protection device 500 of FIG. 17, and the ESD protection device 600 of FIG. 21 are described above with reference to FIGS. 1 to 24. As a result, detailed description about the ESD protection device 720 will not be repeated here.

In some exemplary embodiments, the electronic device 700 may be portable electronic device, such as a smart phone, a mobile phone, a personal digital assistant (PDA), a portable multimedia player (PMP), a digital camera, a music player, a portable game console, a navigation system, a laptop computer, etc.

Figure 26:
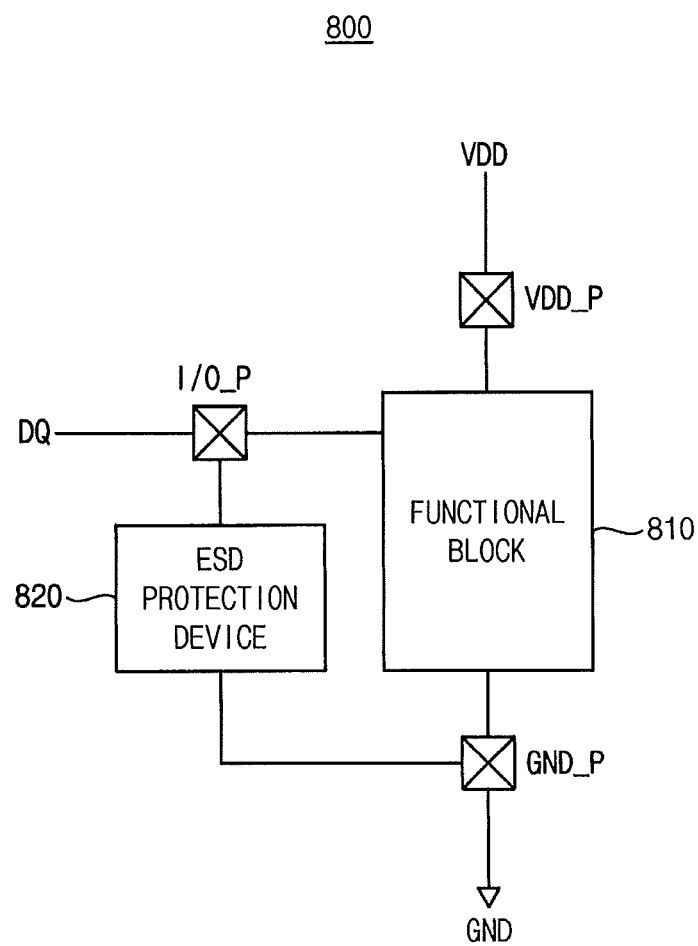
FIG. 26 is a block diagram illustrating an electronic device according to exemplary embodiments.

FIG. 26 is a block diagram illustrating an electronic device according to exemplary embodiments.

Referring to FIG. 26, an electronic device 800 includes a functional block 810 and an ESD protection device 820.

The functional block 810 is coupled to a supply voltage pad VDD_P, which is coupled to a supply voltage VDD, a ground voltage pad GND_P, which is coupled to a ground voltage GND, and a data input/output pad I/O_P. The functional block 810 communicates data DQ through the data input/output pad I/O_P using the supply voltage VDD. In some exemplary embodiments, the functional block 810 may include at least one of an application processor, a data input/output circuit, a logic circuit, and a memory device.

The ESD protection device 820 is coupled between the data input/output pad I/O_P and the ground voltage pad GND_P. When an ESD event occurs such that positive charge flow in the ESD protection device 820 through the data input/output pad I/O_P, the ESD protection device 820 may be turned on to discharge the positive charges to the ground voltage pad GND_P.

The ESD protection device 820 in accordance with principles of inventive concepts may be implemented with one of the exemplary ESD protection device 100 of FIG. 1, the ESD protection device 200 of FIG. 6, the ESD protection device 300 of FIG. 9, the ESD protection device 400 of FIG. 13, the ESD protection device 500 of FIG. 17, and the ESD protection device 600 of FIG. 21, for example.

When the ESD protection device 820 in accordance with principles of inventive concepts is implemented with one of the exemplary ESD protection device 100 of FIG. 1, the ESD protection device 300 of FIG. 9, and the ESD protection device 600 of FIG. 21, the first electrode pad 151, 351, and 651 of the ESD protection device 100, the ESD protection device 300, and the ESD protection device 600 may correspond to the data input/output pad I/O_P and the second electrode pad 152, 352, and 652 of the ESD protection device 100, the ESD protection device 300, and the ESD protection device 600 may correspond to the ground voltage pad GND_P.

When the ESD protection device 820 in accordance with principles of inventive concepts is implemented with one of the exemplary ESD protection device 200 of FIG. 6, the ESD protection device 400 of FIG. 13, and the ESD protection device 500 of FIG. 17, the first electrode pad 251, 451, and 551 of the ESD protection device 200, the ESD protection device 400, and the ESD protection device 500 may correspond to the ground voltage pad GND_P and the second electrode pad 252, 452, and 552 of the ESD protection device 200, the ESD protection device 400, and the ESD protection device 500 may correspond to the data input/output pad I/O_P.

Structures and operations of the ESD protection device 100 of FIG. 1, the ESD protection device 200 of FIG. 6, the ESD protection device 300 of FIG. 9, the ESD protection device 400 of FIG. 13, the ESD protection device 500 of FIG. 17, and the ESD protection device 600 of FIG. 21 are described above with reference to FIGS. 1 to 24. As a result, detailed description of the ESD protection device 820 will not be repeated here.

In some exemplary embodiments, the electronic device 800 may be a portable electronic device, such as a smart phone, a mobile phone, a personal digital assistant (PDA), a portable multimedia player (PMP), a digital camera, a music player, a portable game console, a navigation system, a laptop computer, etc.

The foregoing is illustrative of inventive concepts and is not to be construed as limiting thereof. Although exemplary embodiments have been described, those skilled in the art will readily appreciate that many modifications are possible in the exemplary embodiments without materially departing from the novel teachings and advantages of inventive concepts. Accordingly, all such modifications are intended to be included within the scope of inventive concepts as defined in the claims. As a result, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An electrostatic discharge (ESD) protection device, comprising:
   a semiconductor substrate;
   a first well formed in the semiconductor substrate, the first well having a first conductivity type;
   a second well formed in the semiconductor substrate, the second well contacting the first well, and having a second conductivity type;
   a first impurity region formed in the first well, the first impurity region having the first conductivity type and being electrically connected to a first electrode pad;
   a second impurity region formed in the first well, the second impurity region being spaced apart from the first impurity region in a direction of the second well, having the second conductivity type, and being electrically connected to the first electrode pad;
   a third impurity region formed in the second well, the third impurity region having the second conductivity type and being electrically connected to a second electrode pad; and
   a fourth impurity region formed in the second well, the fourth impurity region being at a position located in a direction of the first well relative to the third impurity region, the fourth impurity region directly contacting the third impurity region, the fourth impurity region having the first conductivity type and being electrically floated.

2. The ESD protection device of claim 1, further comprising:
   a fifth impurity region formed in the second well, the fifth impurity region being spaced apart from the fourth impurity region in a direction of the first well, having the second conductivity type, and being electrically floated.

3. The ESD protection device of claim 2, wherein an impurity concentration of the fifth impurity region is higher than an impurity concentration of the second well.

4. The ESD protection device of claim 2, wherein a holding voltage of the ESD protection device is determined based on a width of the fifth impurity region.

5. The ESD protection device of claim 2, further comprising:
   a sixth impurity region formed at a boundary region between the first well and the second well, the sixth impurity region having the second conductivity type, and being electrically floated; and
   a gate formed above the semiconductor substrate between the second impurity region and the sixth impurity region, the gate being electrically connected to the first electrode pad.

6. The ESD protection device of claim 5, wherein an impurity concentration of the sixth impurity region is higher than an impurity concentration of the second well.

7. The ESD protection device of claim 5, wherein impurity concentrations of the first impurity region and the fourth impurity region are substantially the same, and impurity concentrations of the second impurity region, the third impurity region, the fifth impurity region, and the sixth impurity region are substantially the same.

8. The ESD protection device of claim 5, wherein the first impurity region and the fourth impurity region are formed at the same time by a same ion implantation process, and the second impurity region, the third impurity region, the fifth impurity region, and the sixth impurity region are formed at the same time by a same ion implantation process.

9. The ESD protection device of claim 1, further comprising:
   a fifth impurity region formed in the first well, the fifth impurity region being spaced apart from the second impurity region in a direction of the second well, having the first conductivity type, and being electrically floated.

10. The ESD protection device of claim 9, wherein an impurity concentration of the fifth impurity region is higher than an impurity concentration of the first well.

11. The ESD protection device of claim 9, wherein a holding voltage of the ESD protection device is determined based on a width of the fifth impurity region.

12. The ESD protection device of claim 9, further comprising:
   a sixth impurity region formed at a boundary region between the first well and the second well, the sixth impurity region having the first conductivity type, and being electrically floated; and
   a gate formed above the semiconductor substrate between the fourth impurity region and the sixth impurity region, the gate being electrically connected to the second electrode pad.

13. The ESD protection device of claim 12, wherein an impurity concentration of the sixth impurity region is higher than an impurity concentration of the first well.

14. The ESD protection device of claim 12, wherein impurity concentrations of the second impurity region and the third impurity region are substantially the same, and impurity concentrations of the first impurity region, the fourth impurity region, the fifth impurity region, and the sixth impurity region are substantially the same.

15. The ESD protection device of claim 12, wherein the second impurity region and the third impurity region are formed at the same time by a same ion implantation process, and the first impurity region, the fourth impurity region, the fifth impurity region, and the sixth impurity region are formed at the same time by a same ion implantation process.

16. The ESD protection device of claim 1, wherein the first conductivity type corresponds to n-type, and the second conductivity type corresponds to p-type.

17. The ESD protection device of claim 16, wherein the first electrode pad is coupled to a supply voltage, and the second electrode pad is coupled to a ground voltage.

18. The ESD protection device of claim 1, wherein the first conductivity type corresponds to p-type, and the second conductivity type corresponds to n-type.

19. The ESD protection device of claim 18, wherein the first electrode pad is coupled to a ground voltage, and the second electrode pad is coupled to a supply voltage.

* * * * *